US008832344B2

(12) United States Patent
Ha

(10) Patent No.: US 8,832,344 B2
(45) Date of Patent: Sep. 9, 2014

(54) BASEBOARD, EXTENSION MODULE, AND STRUCTURE FOR CONNECTING BASEBOARD AND EXTENSION MODULE

(76) Inventor: Kilseong Ha, Kanagawa (JP)

( * ) Notice: Subject to any disclaimer, the term of this patent is extended or adjusted under 35 U.S.C. 154(b) by 0 days.

(21) Appl. No.: 14/008,328

(22) PCT Filed: Feb. 20, 2012

(86) PCT No.: PCT/JP2012/001111
§ 371 (c)(1),
(2), (4) Date: Sep. 27, 2013

(87) PCT Pub. No.: WO2012/132202
PCT Pub. Date: Oct. 4, 2012

(65) Prior Publication Data
US 2014/0017912 A1    Jan. 16, 2014

(30) Foreign Application Priority Data
Mar. 30, 2011    (JP) ................................. 2011-074132

(51) Int. Cl.
| G06F 13/00 | (2006.01) |
| H01L 21/00 | (2006.01) |
| H01R 12/73 | (2011.01) |
| H05K 1/14 | (2006.01) |
| H01R 12/52 | (2011.01) |

(52) U.S. Cl.
CPC ............... *H01R 12/52* (2013.01); *H01R 12/73* (2013.01); *H05K 1/14* (2013.01); *H05K 1/144* (2013.01); *H05K 2201/10189* (2013.01)
USPC ........................................... 710/300; 438/74

(58) Field of Classification Search
None
See application file for complete search history.

(56) References Cited

FOREIGN PATENT DOCUMENTS

| JP | 56-011525 A | 2/1981 |
| JP | 63-084097 A | 4/1988 |
| JP | 5-152705 A | 6/1993 |
| JP | 6-061663 A | 3/1994 |
| JP | 7-130438 A | 5/1995 |
| JP | 2002-207542 A | 7/2002 |
| JP | 2005-196486 A | 7/2005 |
| JP | 3721106 B2 | 9/2005 |
| JP | 2006-113794 A | 4/2006 |
| JP | 2007-219642 A | 8/2007 |
| JP | 2009-290072 A | 12/2009 |

*Primary Examiner* — Hyun Nam
(74) *Attorney, Agent, or Firm* — Whitham Curis Christofferson & Cook, PC

(57) ABSTRACT

[Problem] A baseboard and extension modules can be connected without the use of lead lines connected between the baseboard and extension module.
[Solution] A baseboard includes first connectors; an extension module includes a second connector that fits with the first connectors; the first connectors and the second connector include ground terminals, source terminals, and signal terminals connected to signal lines; each of the ground terminal, each of the source terminal, and each of the signal terminals constituting a suit of terminals, a plurality of the suit constituting the first connectors; the ground terminals, the source terminals, and the signal terminals disposed at a constant pitch on the baseboard; the second connector including a suit of terminals, the suit including a ground terminal, a source terminal, and a signal terminal; and the baseboard and the extension module are directly connected only by the first connector and the second connector.

15 Claims, 52 Drawing Sheets

| A | B | D | Y0 | Y1 | Y2 | Y3 |
|---|---|---|----|----|----|----|
| 0 | 0 | D0 | 1 | 0 | 0 | 0 |
| 0 | 1 | D0 | 0 | 1 | 0 | 0 |
| 1 | 0 | D0 | 0 | 0 | 1 | 0 |
| 1 | 1 | D0 | 0 | 0 | 0 | 1 |

Fig. 22B

BASEBOARD, EXTENSION MODULE, AND STRUCTURE FOR CONNECTING BASEBOARD AND EXTENSION MODULE

TECHNICAL FIELD

The present invention relates to a baseboard equipped with signal processing modules, such as a microcomputer, an extension module that extends the function of the baseboard, and a structure for electronically and mechanically connecting the baseboard and the extension module.

BACKGROUND ART

Various baseboards equipped with signal processing modules, such as microcomputers, are commercially available. Such baseboards are connected to extension modules that have specific functions to achieve various objects, such as signal output, control, and other operations.

In this specification, a signal processing module primarily functions as a computer and may be a computer including a central processing unit (CPU) as a microprocessor or any other device that practically functions as a microcomputer through the use of ICs, such as an ASIC or an FPGA, or any specialized IC.

In this specification, a baseboard refers to a circuit board equipped with a signal processing module and connectable to an extension module for achieving specific functions, such as signal output, operation, or control, in accordance with an object. The baseboard may also include an indicator and/or an audio output terminal for indicating the operating state of the signal processing module.

FIG. 46 illustrates a conventional baseboard including a signal processing module or microcomputer. In FIG. 46, the baseboard 1 is equipped with a microprocessor 2 of the microcomputer and other essential circuit devices. The baseboard 1 has a source terminal+Vcc and a ground terminal GND for receiving a DC power from an external power source, a microphone jack 3 for receiving audio signals, audio-signal output terminals or speaker output terminals 5, a USB connector 4, and an LED for displaying the operating state of the microcomputer. The baseboard 1 also has a group 9 of input/output terminals that are primarily used as analog-signal input terminals, and another group 10 of communication input/output terminals that are used for communication with external units.

With reference to FIG. 46, the group 9 of analog-signal input/output terminals is disposed along the left edge of the baseboard 1 and parts of the top and bottom edges. As illustrated in FIG. 46, the group 9 of input/output terminals includes many triplets of terminals, each triplet consisting of three terminals, i.e., a ground terminal 6 to be connected to the ground, a power terminal 7 to be connected to a power terminal or input source+Vcc (=3.3 V), and a signal terminal 8. The ground terminals 6 are disposed closest to the edges of the baseboard 1, the power terminals 7 second closest, and the signal terminals 8 the furthest. All ground terminals 6 are electrically connected with the ground terminal GND, and all power terminals 7 are electrically connected with the source terminal+Vcc.

The microprocessor 2 receives signals from the signal terminals and processes the signals with software installed in advance. The group 10 of communication input/output terminals consists of pairs of terminals. At least one triplet or pair is selected from among the triplets of the analog-signal input/output terminals in the group 9 and the pairs of the communication input/output terminals in the group 10 and is electrically connected to an extension module via lead lines to achieve a specific function through cooperation of the baseboard 1 and the extension module.

FIG. 47 illustrates an example connection of a conventional baseboard equipped with a microcomputer and an extension module. The baseboard represented by reference numeral 11 in FIG. 47 has a different specification from that of the baseboard 1 illustrated in FIG. 46. The baseboard 11 is equipped with a microprocessor 12, and an appropriate number of connectors 13 are disposed along the edges of the baseboard 11. Some of the connectors 13 are to be connected to the ground and the power source, and the others connect to the microprocessor 12 to transmit/receive signals to/from the microprocessor 12.

The baseboard 11 is disposed over a breadboard 14. As well known, a breadboard 14 is a solderless board that allows the construction of an electronic circuit by merely plugging in various electronic parts and jumper lines and is usually used for experiment, evaluation, and prototyping of circuits. The rectangular breadboard 14 has many ground terminal holes 15 connecting to a ground line and disposed in a straight line at a constant pitch along both longitudinal edges. Many source terminal holes 16 connecting to a source line are disposed parallel to the rows of the ground terminal holes 15 and define pairs with the respective ground terminal holes 15. The breadboard 14 has rows of ground terminal holes 15 and rows of power terminal holes 16 along both longitudinal sides. The area between these rows on both sides has a large number of terminal holes 17 arranged in a matrix at a constant pitch. The terminal holes 17 form rows in the transverse direction of the breadboard 14 or a direction orthogonal to the rows of ground terminal holes and the rows of source terminal holes. The terminal holes 17 in each row are electrically connected. The rows of terminal holes are arranged parallel to each other.

The breadboard 14 is equipped with an extension module 20, which is composed of a circuit having a specific function mounted on a circuit board. A plurality of terminal pins of the extension module 20 are fit into the terminal holes 17 in different rows aligned along the longitudinal direction of the breadboard 14. Thus, the terminal pins of the extension module 20 are electrically connected to the terminal holes 17 in different rows of terminal holes in the breadboard 14. The ground pin of the extension module 20 is inserted, so that one end of a jumper line 19 is fit into one of the electrically conductive terminal holes 17 in a single row. The other end of the jumper line 19 is fit into one of the ground terminal holes 15 to connect the ground pin of the extension module 20 to the ground line. Similarly, a source pin of the extension module 20 is inserted, so that an end of the jumper line 19 is fit into one of the electrically conductive terminal holes 17 in a single row. The other end of the jumper line 19 is fit into one of the source terminal holes 16 to connect the source pin of the extension module 20 to the source line.

One end of a lead line 18 is fit into one of the terminal holes 17 in a single row that is electrically connected to a signal terminal of the extension module 20, and the other end of the lead line 18 is connected to a predetermined one of the connectors 13 of the baseboard 11. In this way, the signal terminal of the extension module 20 is electrically connected to a predetermined terminal of the microprocessor 12 or a predetermined connection point of the baseboard 11. A plurality of lead lines 18 is provided. A plurality of connection points of the baseboard 11 is connected to a plurality of connection points of the extension module 20 via the connectors 13 of the baseboard 11, the lead lines 18, and the terminal holes 17 in the breadboard 14.

As described above, the structure for connecting a conventional baseboard and an extension module consist of lead lines. In the conventional baseboard illustrated in FIG. 46, first ends of lead lines are soldered to the terminals. Alternatively, lead lines are extracted from connectors fixed to the terminals, and second ends of the lead lines are soldered to or connected via connectors to the extension module.

A plurality of lead lines connecting the baseboard and the extension module complicates the structure and the connecting operation. Furthermore, a complicated operation of disconnection and reconnection of the lead lines will be required for a change in the specification, which may lead to faulty wiring.

The related art of the present invention includes the following inventions. Patent Literature 1 describes a system for part boards that electrically connects a stack of connection boards to a plurality of part boards disposed in a direction orthogonal to the connection boards by connecting a first group of contact devices disposed along the edges of the part boards and a second group of contact devices disposed along the edges of the connection boards. Patent Literature 1 only discloses the mechanical structure for directly connecting the connection boards and the part boards by engaging first and second contacts, which are equivalent to pins and jacks of a connector, but does not disclose a specific electrical connection.

Patent Literature 2 discloses a power source structure for a communication device. The structure has a support that is an assembly of multiple columns having a U-shaped cross-section and that accommodates a power source bus to increase the wiring area on the back side of the support, so as to increase the number of feeding cables to be connected and enhance the efficiency of the wiring operation. Patent Literature 2 has relevance to the present invention in the ease of wiring in the present invention but does not have direct relevance in the structure for connecting a baseboard equipped with a microcomputer and an extension module.

Patent Literature 3 discloses a data communication system connecting a plurality of devices with an SPI device. The system includes a communication manager adjusting serial communication between a mater device and slave devices. The serial communication to the slave devices is controlled by the communication manager on the basis of an appropriate physical protocol via communication interfaces. According to the invention described in Patent Literature 3, communication protocols may be switched among chip selecting signal lines to establish communication among the devices using the respective optimal communication protocols. Patent Literature 3, however, does not mention a structure for connecting a baseboard equipped with a microcomputer and an extension module.

CITATION LIST

Patent Literature

[PTL 1] Japanese Patent Application Laid-Open No. 05-152705
[PTL 2] Japanese Patent No. 3721106
[PTL 3] Japanese Patent Application Laid-Open No. 2005-196486

SUMMARY OF THE INVENTION

Technical Problem

An object of the present invention is to solve the drawbacks described above of a conventional structure for connecting a baseboard and an extension module, in other words, to provide a baseboard, an extension module, and a structure for connecting the baseboard and the extension module that can eliminate lead lines for connection between the baseboard and the extension module, simplify the structure and the connecting operation, eliminate the complicated operation of disconnection and reconnection of lead lines for a change in specification, and significantly reduce faulty wiring.

Solution to Problem

A baseboard according to the present invention is to be connected to an extension module having a specific function, the baseboard comprising: a signal processing unit; and first connectors to be connected to the extension module; the first connectors comprising ground terminals connected to ground lines, source terminals connected to source lines, and signal terminals connected to signal lines, each of the ground terminals, each of the source terminals, and each of the signal terminals constitute a suit of terminals, a plurality of suits being disposed on the baseboard at a constant pitch and constituting the first connectors, and the first connectors are connectable to a connector of the extension module.

An extension module according to the present invention has a specific function and is connected to a baseboard comprising a signal processing unit, the extension module comprising: a second connector connectable to a first connector of the baseboard for connection to the baseboard, the second connector comprising first suits of terminals, each suit comprising a first ground terminal connectable to a second ground terminal of the first connector, a first source terminal connectable to a second source terminal of the first connector, and a first signal terminal connectable to a second signal terminal of the first connector, and the first suits of the second connector being disposed at a pitch identical to the pitch of second suits of terminals constituting the first connector, the second connector being connectable to a plurality of adjacent first connectors.

Advantage Effects of Invention

An extension module is mechanically and electrically connected to a baseboard through connection of a second connector of the extension module to one first connector corresponding to the extension module selected from first connectors of the baseboard. Ground terminals of the extension module are connected to a ground line and source terminals to a source line via the first and second connector. In this way, the extension module is electrically connected to the baseboard without lead lines. As a result, the structure for connecting the baseboard and the extension modules is simplified, and the connection operation is facilitated. The extension module can be replaced by simply removing the extension module and inserting another extension module having a different specification. Thus, the specification of the extension modules can be readily changed, and faulty wiring can be significantly reduced.

BRIEF DESCRIPTION OF DRAWINGS

FIG. 22B is a truth table of the demultiplexer.

DESCRIPTION OF EMBODIMENTS

Embodiments of a baseboard, an extension module, and a structure for connecting the baseboard and the extension module according to the present invention will now be described with reference to the drawings.

Embodiments

Figure 1:
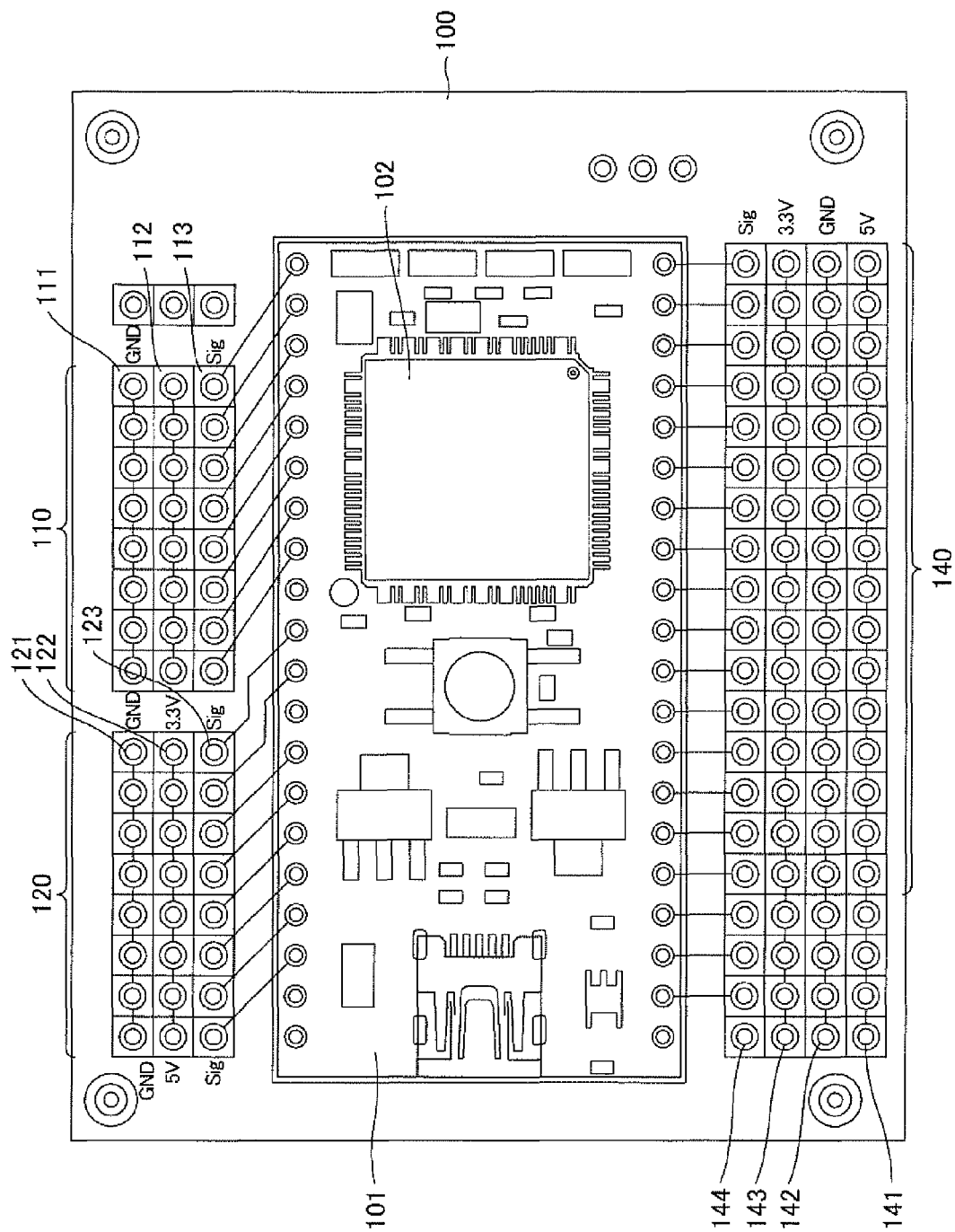
FIG. 1 is a simplified plan view of an example baseboard according to an embodiment involving a baseboard, an extension module, and a structure for connecting the baseboard and the extension module according to the present invention.
Figure 6:
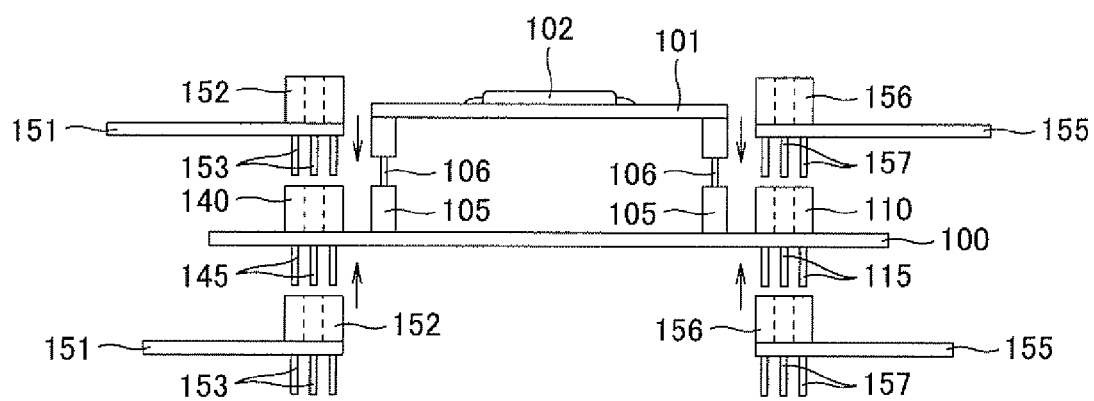
FIG. 6 is a front view of the connection between the baseboard and extension modules.

FIG. 1 illustrates an embodiment of a baseboard according to the present invention. In FIG. 1, a microcomputer 102 is attached on a side of a baseboard 100 with a microcomputer board 101 disposed therebetween. As also illustrated in FIG. 6, many connection pins 106 extend downward along the longitudinal edges of the microcomputer board 101. The connection pins 106 are inserted into connectors 105 fixed on the upper surface of the baseboard 100 to mount the microcomputer board 101 on the baseboard 100.

Connectors 110, 120, and 140 are attached to the upper surface of the baseboard 100 along the longitudinal edges of the baseboard 100 parallel to and outward of the connectors 105. The connectors 110 and 120 are disposed along one edge of the baseboard 100, while the connector 140 is disposed along the other edge of the baseboard 100. The connectors 110, 120, and 140 each include at least ground terminals connected to a ground line, source terminals connected to a source line, and signal terminals connected to a signal line. The ground terminals, the source terminals, and the signal terminals are grouped into triplets to constitute the connectors 110, 120, and 140.

The connectors 110, 120, and 140 will now be described in detail. The connectors 110 consist of eight triplets of terminals, each triplet consisting of a ground terminal, a source terminal connected to a 4.8 to 6.0 V power source, and a signal terminal. The eight ground terminals of the eight triplets constitute a group 111 of ground terminals; the eight source terminals constitute a group 112 of source terminals; and the eight signal terminals constitute a group 113 of signal terminals.

The connector 120 includes eight triplets of terminals, each triplet consisting of a ground terminal, a 3.3 or 5 V source terminal, and a signal terminal. The eight ground terminals of the eight triplets constitute a group 121 of ground terminals; the eight source terminals constitute a group 122 of source terminals; and the eight signal terminals constitute a group 123 of signal terminals.

The connector 140 consists of sixteen quadruplets of terminals, each quadruplet consisting of a 5 V source terminal, a ground terminal, a 3.3 V source terminal, and a signal terminal. The sixteen 5 V source terminals of the sixteen quadruplets constitute a group 141 of source terminals; the sixteen ground terminals constitute a group 142 of ground terminals; the sixteen 3.3 V source terminals constitute a group 143 of source terminals; and the sixteen signal terminals constitute a group 144 of signal terminals.

Four quadruplets of terminals are adjacent to the connector 140. These four quadruplets, however, have no direct relevance to the configuration of the present invention; thus, a description thereof is omitted. The triplets and quadruplets of the connectors 110, 120, and 140 are aligned at a constant pitch. The ground terminals, source terminals, and signal terminals in the triplets and quadruplets are aligned at a constant pitch along separate straight lines, all terminals being arrayed in a matrix.

The connectors 110, 120, and 140 attached on the baseboard 100 are connected to connectors on extension modules as will be described below. The connectors 110, 120, and 140 are referred to as first connectors, and the connectors on extension modules connected to the first connectors are referred to as second connectors. The first connectors 110, 120, and 140 are female connectors or jacks. Alternatively, the connectors 110, 120, and 140 may be male connectors, plugs, or pins, depending on the type of the second connectors on an extension module.

Figure 2:
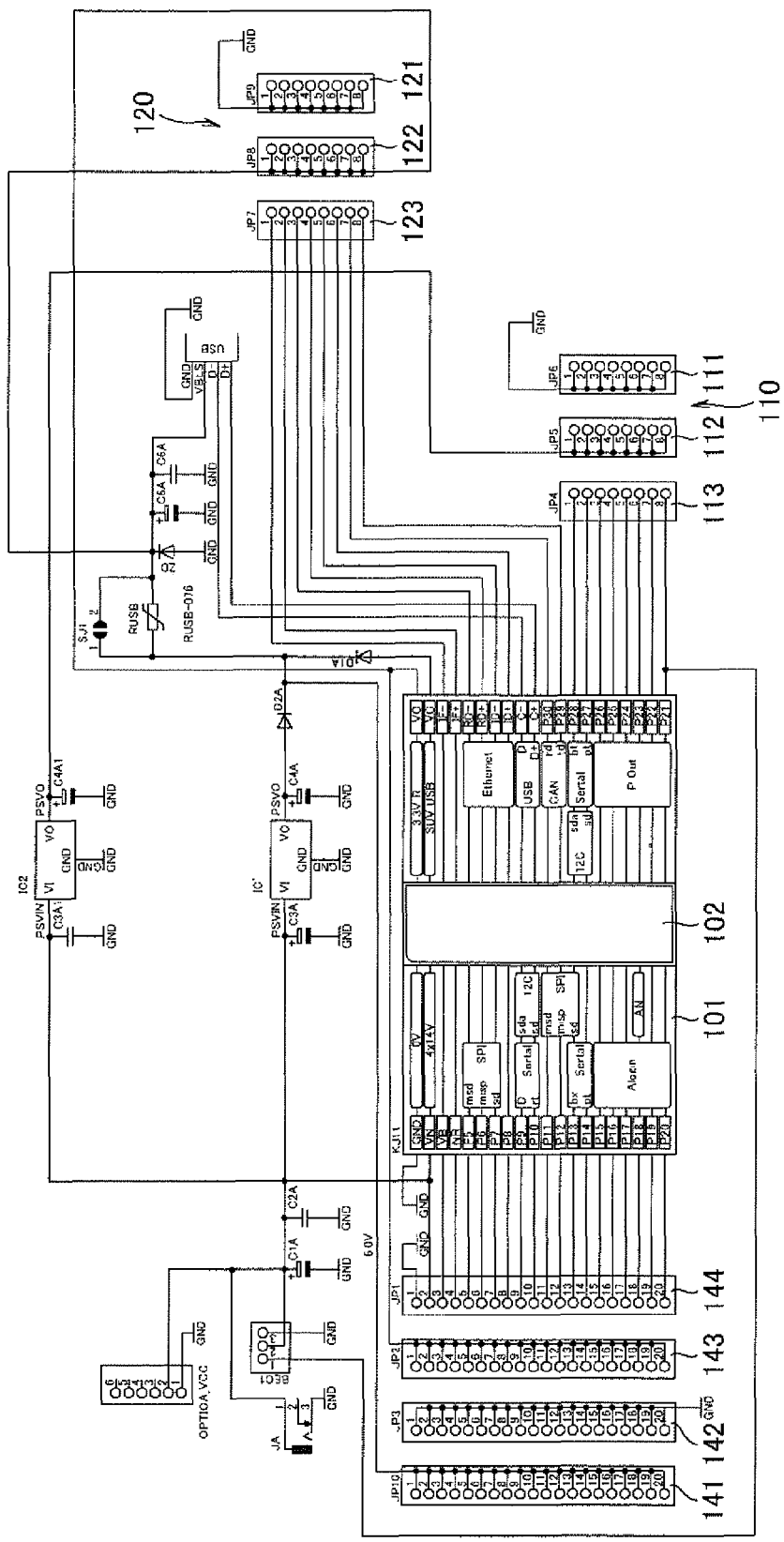
FIG. 2 is a circuit diagram of the baseboard.
Figure 5:
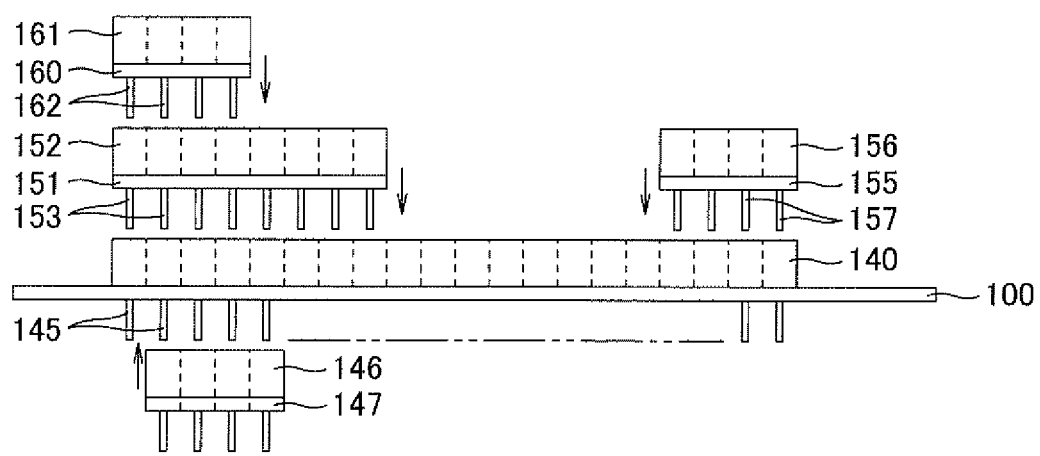
FIG. 5 is side view of the connection between the baseboard and extension modules.

As illustrated in FIG. 2, all ground terminals of the first connectors 110, 120, and 140 are connected to a common ground line, all 3.3 V source terminals are connected to a 3.3 V source line, and all 5 V source terminals are connected to a 5 V source line. The signal terminals of the first connectors 110, 120, and 140 are electrically connected to respective terminals on the microcomputer 102 via the circuit pattern of the baseboard 100, the connectors 105, the connection pins 106, and the circuit pattern of the microcomputer board 101, which are illustrated in FIG. 5. The baseboard 100 is equipped with 3.3 V and 5 V source input terminals. The microcomputer board 101 is equipped with an indicator including an LED for indication of the operating state of the microcomputer, a USB jack, and other circuits, which are not illustrated in FIG. 2.

Figure 3:
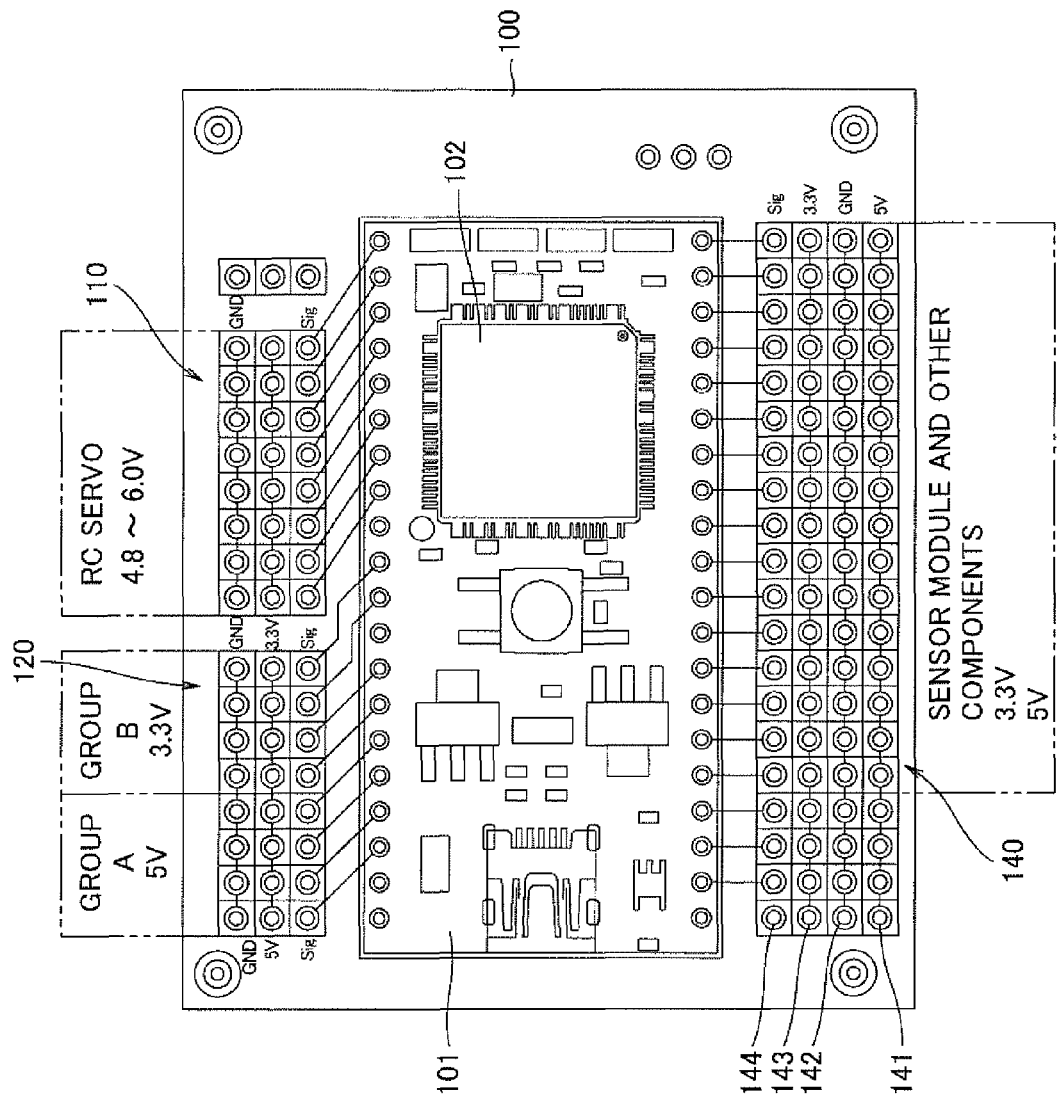
FIG. 3 is a schematic plan view of connectors of the baseboard.

FIG. 3 illustrates an example extension module connectable to the first connectors 110, 120, and 140. The first connectors represented by reference numeral 110 are connectors for radio control (RC) servos, and the source terminals are connected to a 5 V source line. The first connectors represented by reference numeral 120 are categorized into a group A of connectors for a cable connection module and a group B of connectors for a cable connection module, each group consisting of four triplets of terminals. The source terminals in the group B are connected to a 3.3 V source line, and the source terminals in the group A are connected to a 5 V source line. The first connector represented by reference numeral 140 is for connection of, for example, a sensor module and consists of sixteen pairs of terminals in total, each pair including a source terminal connected to a 3.3 V source line and a source terminal connected to a 5 V source line.

Figure 4:
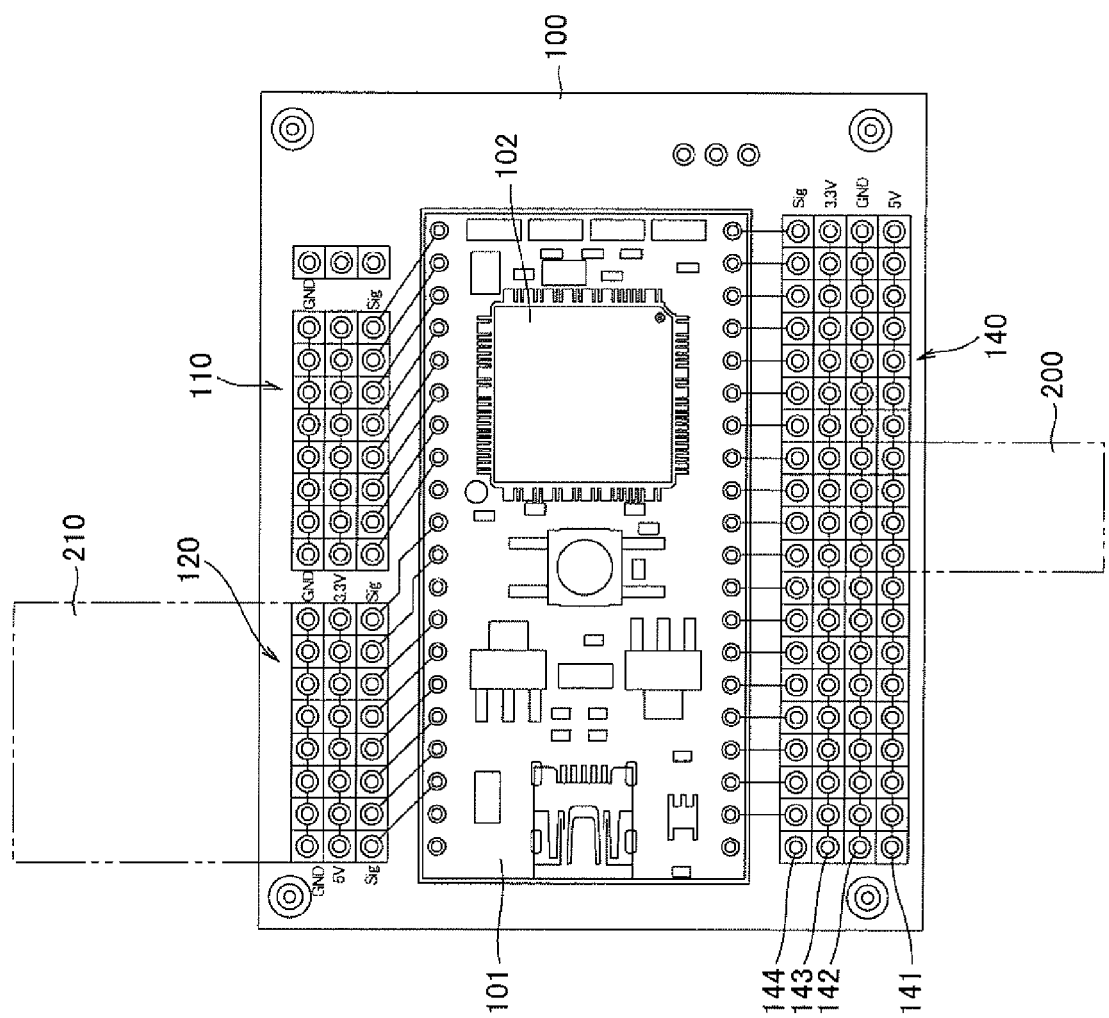
FIG. 4 is a schematic plan view of the connection between the connectors of the baseboard and extension modules.
Figure 11:
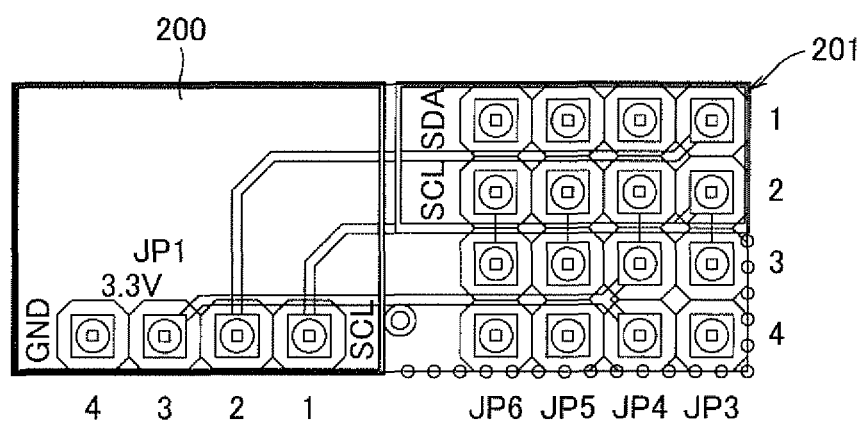
FIG. 11 is a plan view of an adapter board for the I2C compass module.

FIG. 4 schematically illustrates an extension module board connected to the baseboard 100 having the first connectors 110, 120, and 140. In FIG. 4, reference numeral 200 denotes an adapter board for an I2C compass module connecting the baseboard 100 to an I2C compass module equipped with an orientation sensor. As illustrated in FIG. 11, the adapter board 200 has a second connector 201 that is connected to four of the quadruplets of terminals in the first connector 140. The second connector 201 fits into the first connector 140 to mechanically and electrically connect the baseboard 100 and the adapter board 200 for an I2C compass module.

Figure 15:
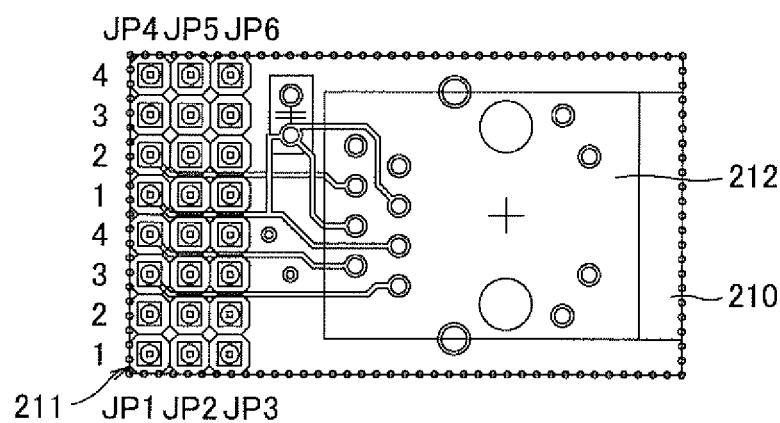
FIG. 15 is a plan view of a LAN connector module board.

In FIG. 4, reference numeral 210 denotes a LAN connector module. As illustrated in FIG. 15, the board of the LAN connector module 210 has a second connector 211 connected to the eight triplets of terminals constituting the first connector 120. The second connector 211 fits into the first connector 120 to mechanically and electrically connect the baseboard 100 and the LAN connector module 210.

A stack of extension module boards can be connected to the first connector of the baseboard 100. FIG. 5 illustrates an example stack of multiple extension module boards. The first connector 140, consisting of the aligned quadruplets of terminals, is fixed to the front side (upper side in FIG. 5) of the baseboard 100. The first connector 140 is a female connector (jacks). A connector consisting of male terminals (pins) 145 corresponding to the female terminals protrudes from the back side of the baseboard 100. The terminals 145 are fit into a female connector (jacks) of the extension module to mechanically and electrically connect the extension module to the baseboard 100. The first connector 140 of the baseboard 100 can be fit together with a second connector or connector pins of another extension module.

In FIG. 5, reference numerals 151 and 155 denote extension modules mounted on the circuit board, and reference numerals 153 and 157 denote second connectors or terminal pins protruding from the back sides of the extension modules 151 and 155, respectively. The front sides of the extension modules 151 and 155 respectively provided with female connectors (jacks) 152 and 156 consisting of terminals corresponding to the terminal pins. The configuration of the female connectors 152 and 156 is the same as that of the first connector 140 of the baseboard 100. The connectors 152 and 156 can be fit together with second connectors of other extension modules. Thus, a female connector provided on an extension module is also referred to as a first connector.

In the embodiment illustrated in FIG. 5, the first connector 152 of the extension module 151 is fit together with a second connector or terminal pins 162 of another extension module 160. The extension module 160 has a first connector 161. The first connector 161 is fit together with a second connector of another extension module to form a stack of extension modules. The baseboard 100 and the multiple extension modules mechanically connected into a stack by fitting together the first connectors and the second connectors are also electrically connected via the first and second connectors. The connector pins may be partially exposed when the first connectors and the second connectors are fit together. Probes of measuring machines and testing machines may be put into contact with the exposed connector pins for measurements, tests, and inspections.

The male terminals 145 protruding from the back side of the baseboard 100 functions as a connector. The connector can be connected to a female connector 146 if desired. The baseboard 100 can be connected to another extension module 147 via the female connector 146. In such a case, the connector consisting of the terminals 145 is referred to as first connector, and the female connector 146 on the extension module 147 is referred to as second connector. The terminals 145 on the back side of the baseboard 100 may be removed, if not to be used.

Figure 7A:
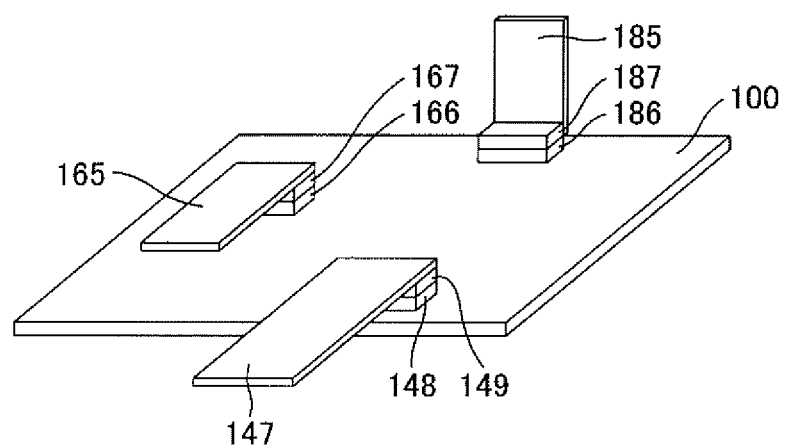
FIG. 7A is a perspective view of other connections of the baseboard and extension modules.
Figure 7B:
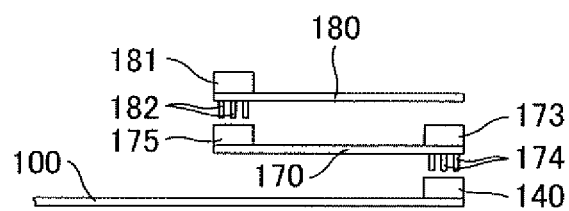
FIG. 7B is a side view of other connections of the baseboard and extension modules.

When multiple extension modules are stacked, the extension modules may be stacked in alternating directions by disposing the first and second connectors of the extension modules along opposite edges. FIG. 7B illustrates such an embodiment. The first connector 140 of the baseboard 100 is fit together with a second connector 174 disposed along an edge on the back side of an extension module 170; a first connector 175 is disposed along the edge and side opposite to the second connector 174; and the first connector 175 is fit together with a second connector 182 of another extension module 180. As a result, the baseboard 100 and the two extension modules 170 and 180 are stacked in alternating directions. The extension modules 170 and 180 respectively have first connectors 173 and 181 disposed on one side of the boards of the extension modules 170 and 180 opposite to the second connectors 174 and 182. Second connectors of other extension modules may be fit to the first connectors 173 and 181.

Figure 8A:
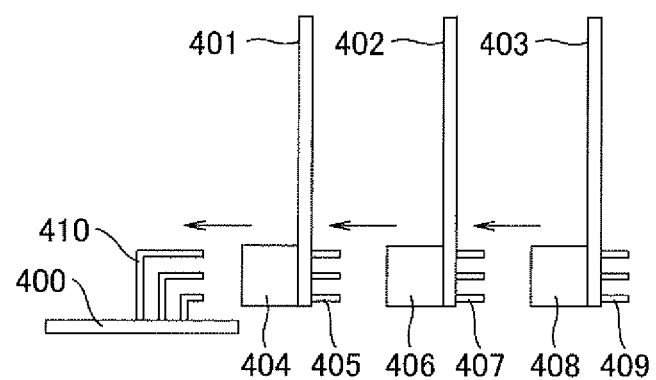
FIG. 8A is a side view of other connections of the baseboard and extension modules.
Figure 8B:
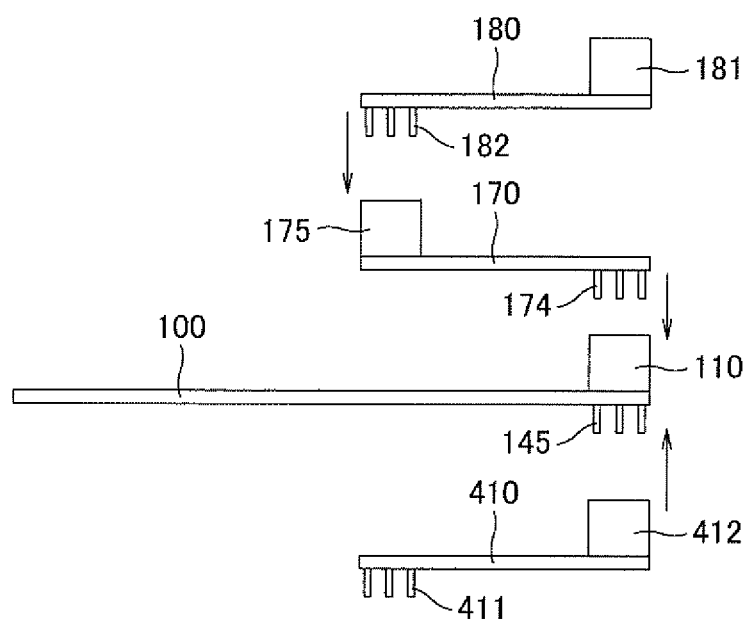
FIG. 8B is a side view of other connections of the baseboard and extension modules.
Figure 8C:
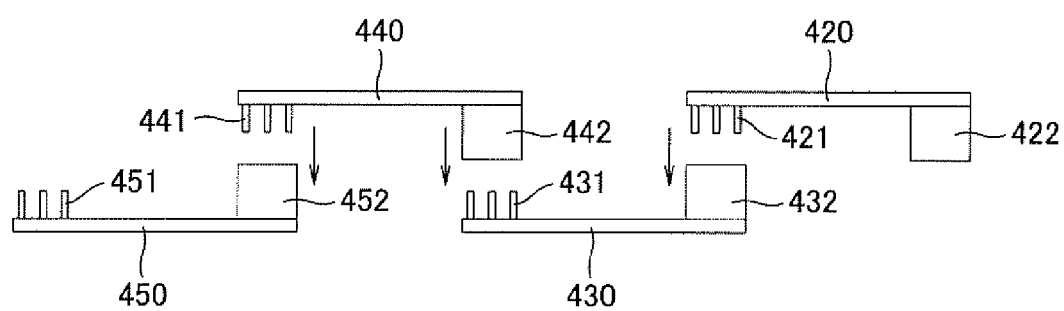
FIG. 8C is a side view of other connections of the baseboard and extension modules.

Various embodiments of the multiple extension modules are possible in addition to that illustrated in FIG. 7B and those illustrated in FIGS. 8A, 8B, and 8C. In FIG. 8A, a first connector 410 provided on a circuit board 400 is a male connector consisting of multiple pins protruding from the circuit board 400. The pins bend at a 90° angle and extend horizontally. The tip surfaces of the pins extending horizontally align on a single vertical plane at a constant pitch along the vertical direction. The first connector 410 fits into a second connector 404 of an extension module 401. The second connector 404 of the extension module 401 receives the first connector 410 in a direction orthogonal to the surface of the extension module 401. Thus, the extension module 401 is connected perpendicularly to the surface of the circuit board 400. The extension module 401 includes a second connector 405 consisting of multiple pins disposed at positions corresponding to the positions of the second connector 404 on the other side of the board of the extension module 401.

The embodiment illustrated in FIG. 8A includes two other extension modules 402 and 403 having connectors similar to those of the extension module 401. That is, the extension module 402 has a second connector 406 and a first connector 407, and the extension module 403 has a second connector 408 and a first connector 409. The second connector 406 of the extension module 402 fits together with the first connector 405 of the extension module 401, and the second connector 408 of the extension module 403 fits together with the first connector 407 of the extension module 402. In this way, the three extension modules 401, 402, and 403 are vertically stacked on the circuit board 400 in parallel to each other. The circuit board 400 may be a baseboard.

In the embodiment illustrated in FIG. 8B, each extension module has a first connector and a second connector disposed at opposite edges and on opposite faces, to connect multiple extension modules in series. In FIG. 8B, the baseboard 100, similar to the embodiment described above, has a first connector 110 disposed at one edge and a second connector 145 disposed on the surface of baseboard 100 opposite to that on which the first connector 110 is disposed. The first connector 110 fits together with a second connector 174 of an extension module 170. A first connector 175 disposed at an edge remote from the second connector 174 on the extension module 170 fits together with a second connector 182 of another extension module 180. In this way, the baseboard 100 and the two extension modules 170 and 180 overlie each other to form a stack. The second connector 145 of the baseboard 100 fits into a second connector 412 of an extension module 410 to form a stack together with the two extension modules 170 and 180. The extension module 410 has a first connector 411 at an edge remote from the second connector 412 on the opposite side. A second connector of another extension module can be fit together with the first connector 411.

In the embodiment illustrated in FIG. 8C, extension modules have first connectors and second connectors on the same surface at opposite edges. In this embodiment, multiple extension modules are connected in series and extend in the horizontal direction. The four extension modules 420, 430, 440, and 450 illustrated in FIG. 8C respectively have male first connectors 421, 431, 441, and 451 at one edge and female second connectors 422, 432, 442, and 452 at the opposite edge. The first connector 421 of the extension module 420 fits into the second connector 432 of the extension module 430; the first connector 431 of the extension module 430 fits into the second connector 442 of the extension module 440; and the first connector 441 of the extension module 440 fits into the second connector 452 of the extension module 450. Thus, the four extension modules 420, 430, 440, and 450 are alternatingly reversed and connected in series. The second connector 422 of the extension module 420 on the right in FIG. 8C can be fit together with a male first connect on a baseboard. The first connector 451 of the extension module 450 on the left in FIG. 8C can be fit into a female first connector on a baseboard.

Figure 9:
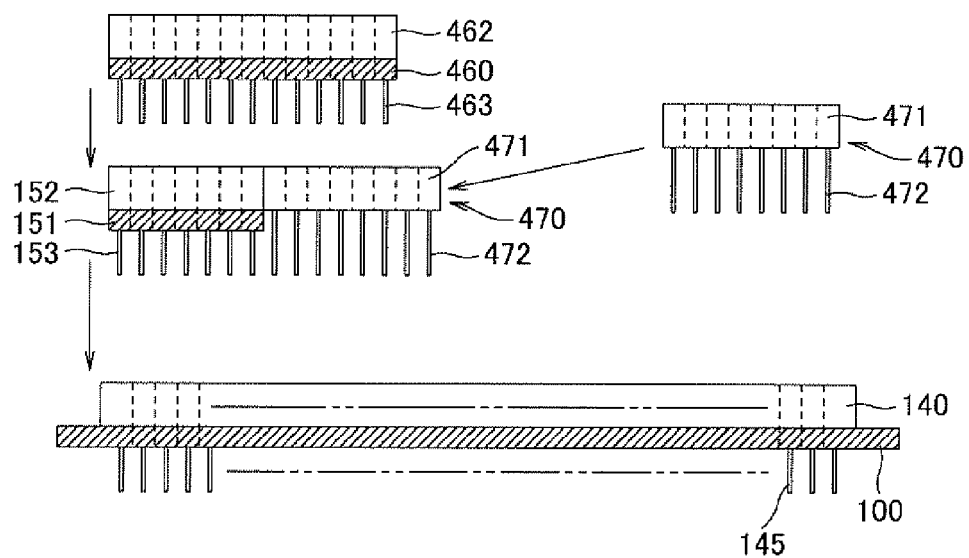
FIG. 9 is a side view of other connections of the baseboard and extension modules.

When multiple extension modules are stacked on a baseboard parallel to each other, the width of a first extension module disposed between other extension modules in a stack may be smaller than the width of a second extension module directly below the first extension module. FIG. 9 illustrates an embodiment that allows stacking without any trouble. In FIG. 9, a first connector 140 disposed at one edge of the baseboard 100 is fit together with a second connector 153 of an extension module 151, and a first connector 152 of the extension module 151 is fit together with a second connector 463 of another extension module 460. If the width of the extension module 151 is smaller than the width of the extension module 460, some of the terminal pins of the second connector 463 of the extension module 460 stacked on the extension module 151 cannot be connected with the first connector 152 of the extension module 151 and a connector on the baseboard 100, remaining unconnected.

The embodiment illustrated in FIG. 9 further includes an auxiliary connector 470 that fits together with the terminal pins of the extension module 460 unconnected to the first connector 152 of the extension module 151. The auxiliary connector 470 includes a second connector 472 consisting of terminal pins and a female first connector 471 but does not include a circuit board. Since a circuit board is not provided, the terminals are largely exposed. The auxiliary connector 470 is large enough and has enough terminals to fit together with the terminal pins that are unconnected with the first connector 152 of the extension module 151. The auxiliary connector 470 is fit into the first connector 140 of the baseboard 100 adjacent to the extension module 151, and the extension module 460 is fit into both the extension module 151 and the auxiliary connector 470. In this way, all of the terminals of the extension module 151 and the extension module 460 are connected to the baseboard 100.

The connection position of the extension module on baseboard 100 and the orientation of the connected extension modules are not limited. FIG. 7A illustrates various embodiments. In FIG. 7A, a second connector 149 of an extension module 147 is fit into a first connector 148 disposed along an edge of a baseboard 100, being connected to and cantilevered from the baseboard 100. A second connector 167 of an extension module 165 is fit into a first connector 166 disposed in the inner area of the baseboard 100, being connected to the baseboard 100 and disposed in the projection plane of the baseboard 100. A second connector 187 of an extension module 185 is inserted into a first connector 186 in a direction parallel to the surface of the extension module 185 and is connected to the baseboard 100 in a vertically erected orientation.

Various other embodiments can be employed for the connection of the baseboard 100 and extension modules and the stacking of the extension modules, and may be modified freely.

Figure 10:
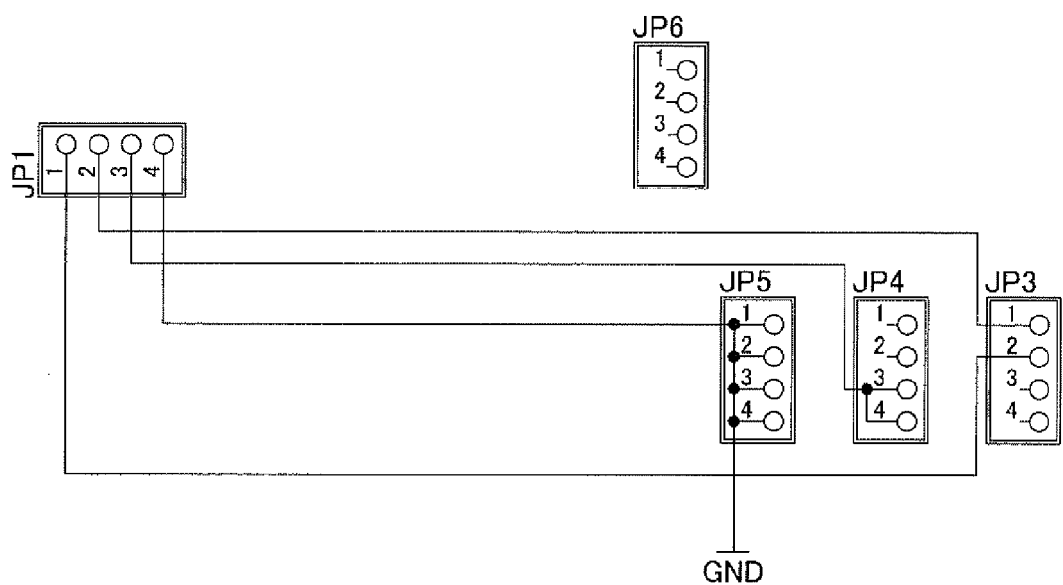
FIG. 10 is a circuit diagram illustrating an example board for an I2C compass module according to the present invention.

FIG. 10 illustrates the electrical connection between terminals of a second connector 201 of an adapter board 200 for an I2C compass module for connecting the I2C compass module and a baseboard 100. The adapter board 200 for an I2C compass module includes four terminals represented by reference characters JP1 in FIG. 11. The I2C compass module is mounted on the four terminals by an appropriate means, such as soldering. The second connector 201 includes a row JP6 of source terminals that fit together with the row 141 of the 5 V source terminals of the baseboard 100 (see FIG. 1), a row JP5 of ground terminals that fit together with the row 142 of ground terminals (see FIG. 1), a row JP4 of source terminals that fit together with the row 143 of the 3.3 V source terminals (see FIG. 1), and a row JP3 of signal terminals that fit together with the row 144 of signal terminals (see FIG. 1). The adapter board 200 for an I2C compass module uses a 3.3 V power source. Thus, leads are not connected to the row JP6 of the 5 V source terminals, as illustrated in FIG. 10.

Figure 12:
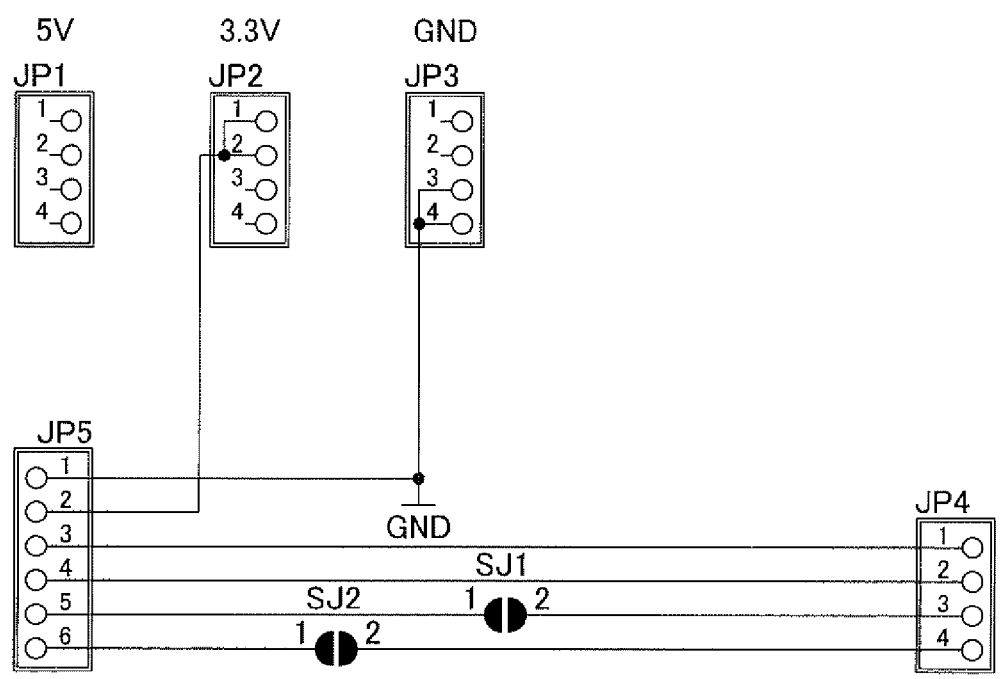
FIG. 12 is a circuit diagram illustrating an example adapter board for an I2C inertial-measurement-unit (IMU) module according to the present invention.
Figure 13:
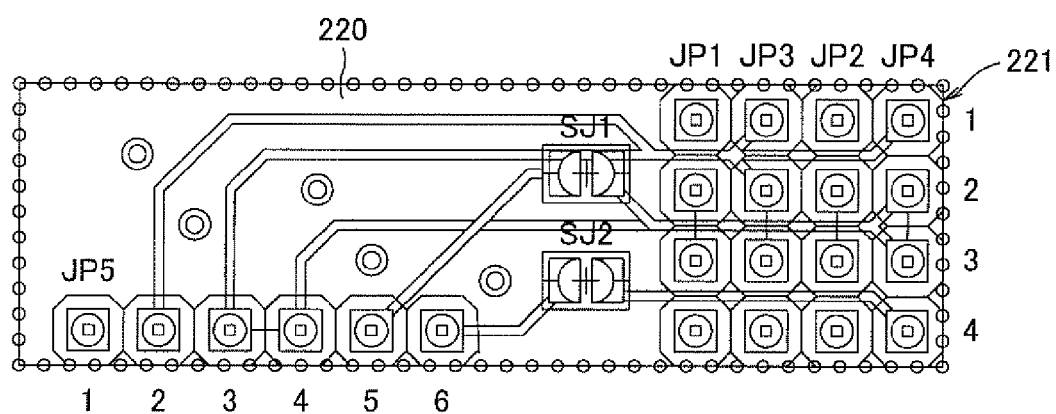
FIG. 13 is a plan view of the adapter board for the I2C inertial-measurement-unit.

FIG. 13 illustrates an adapter board 220 for an I2C IMU module connected to the first connector 140 of the baseboard 100. FIG. 12 illustrates the electrical connection of the terminals of the second connector 221. The adapter board 220 for an I2C IMU module is connected to an IMU module. The IMU module includes at least one of a three-axis acceleration sensor, an angular velocity sensor (gyro), and a geomagnetic (orientation) sensor. The second connector 221 provided on the adapter board 220 for an I2C IMU module includes a row JP1 of source terminals that fit together with the row 141 of the 5 V source terminals on the baseboard 100 (see FIG. 1), a row JP3 of ground terminals that fit together with the row 142 of ground terminals (see FIG. 1), a row JP2 of source terminals that fit together with the row 143 of the 3.3 V source terminals (see FIG. 1), and a row JP4 of signal terminals that fit together with the row 144 of signal terminals (see FIG. 1). The adapter board 220 for an I2C IMU module includes six terminals represented by reference characters JP5 in FIGS. 12 and 13. The I2C IMU module is mounted on the six terminals by an appropriate means such as soldering. The adapter board 220 for an I2C IMU module uses a 3.3 V power source. Thus, leads are not connected to the row JP1 of the 5 V source terminals.

Figure 18:
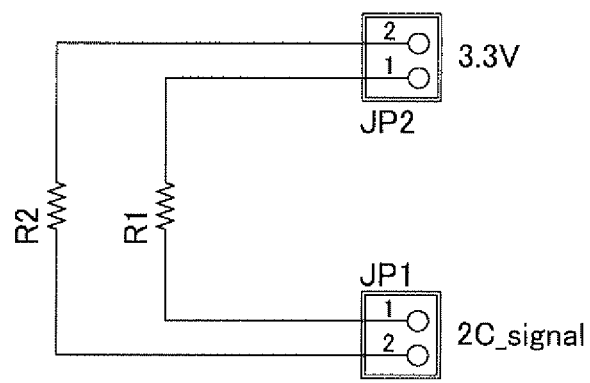
FIG. 18 is a circuit diagram of an example pull-up resistor cap required for the use of an extension module or I2C module.
Figure 19:
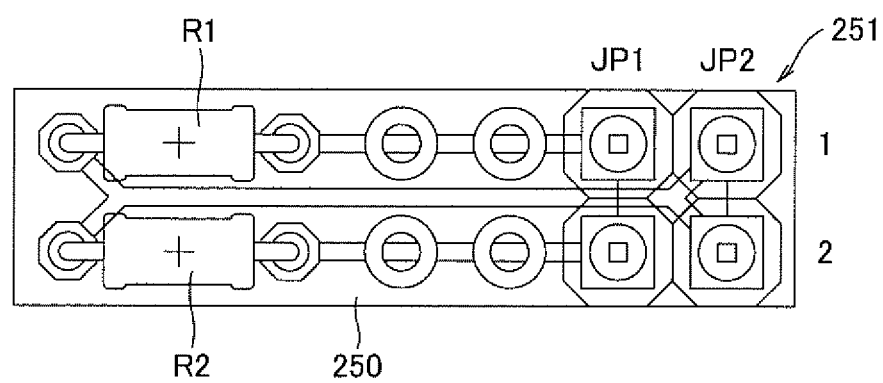
FIG. 19 is a plan view of the pull-up resistor cap.

To use an I2C module, the signal lines of the I2C module must be pulled up. To do this, a pull-up resistor board 250, which is illustrated in FIGS. 18 and 19, is stacked on the adapter board 220 for an I2C module connected to the baseboard 100 via the first and second connectors. The pull-up resistor board 250 includes a second connector 251 that fits into the first connector of the adapter board 220 for an I2C module. The second connector 251 includes a row JP2 of two terminals connected to two signal lines and a row JP1 of two terminals connected to two source lines. Pull-up resistors R1 and R2 are connected to respective signal terminals and respective source terminals. The first connector of the adapter board 220 for an I2C module is fit together with the second connector of the pull-up resistor board 250 to pull up the signal lines of the I2C module so that the I2C module fulfills a specific function. Many embodiments of the pull-up resistor board 250 can be employed, similar to those of the board of the extension modules. In addition to pulling up signal lines, this may be applied to the pull-down of signal lines.

Figure 14:
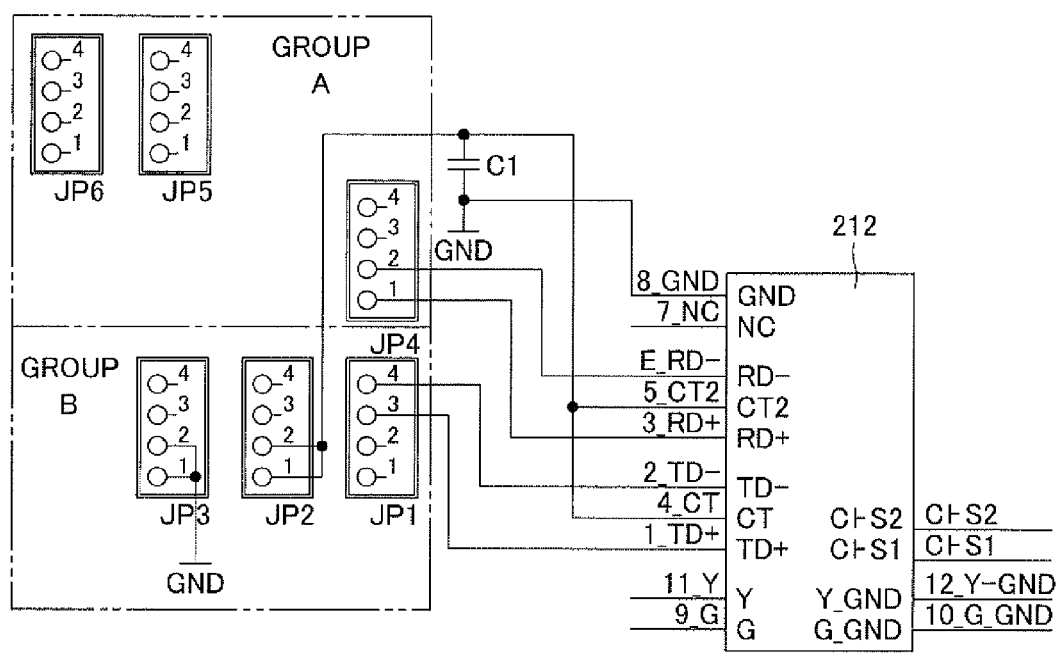
FIG. 14 is a circuit diagram illustrating an example LAN connector module board according to the present invention.

FIG. 15 illustrates an embodiment board of the LAN connector module 210. FIG. 14 illustrates the electrical connection of the row of terminals of the second connector 211 provided on the LAN connector module 210 and a control device 212. The terminals of the second connector 211 of the LAN connector module 210 are connected to the terminals of the first connector 120 of the baseboard 100, which is illustrated in FIG. 1. As illustrated in FIG. 3, the first connector 120 is categorized into groups A and B of connectors for cable connection modules, each group consisting of four triplets of terminals. The second connector 211 of the LAN connector module 210 has a row JP1 of signal terminals, a row JP 2 of 3.3 V source terminals, and a row JP3 of ground terminals, all being connected to the connectors in group B, and a row JP4 of signal terminals, a row JP 5 of 5 V source terminals, and a row JP6 of ground terminals, all being connected to the connectors in group A. In a case of installation of the device according to the present invention to a mobile device, such as a radio-controlled device or a robot, that does not require a LAN port or connectors for various cable connections, the LAN connector module board 210 may be removed to reduced size and weight.

Figure 16:
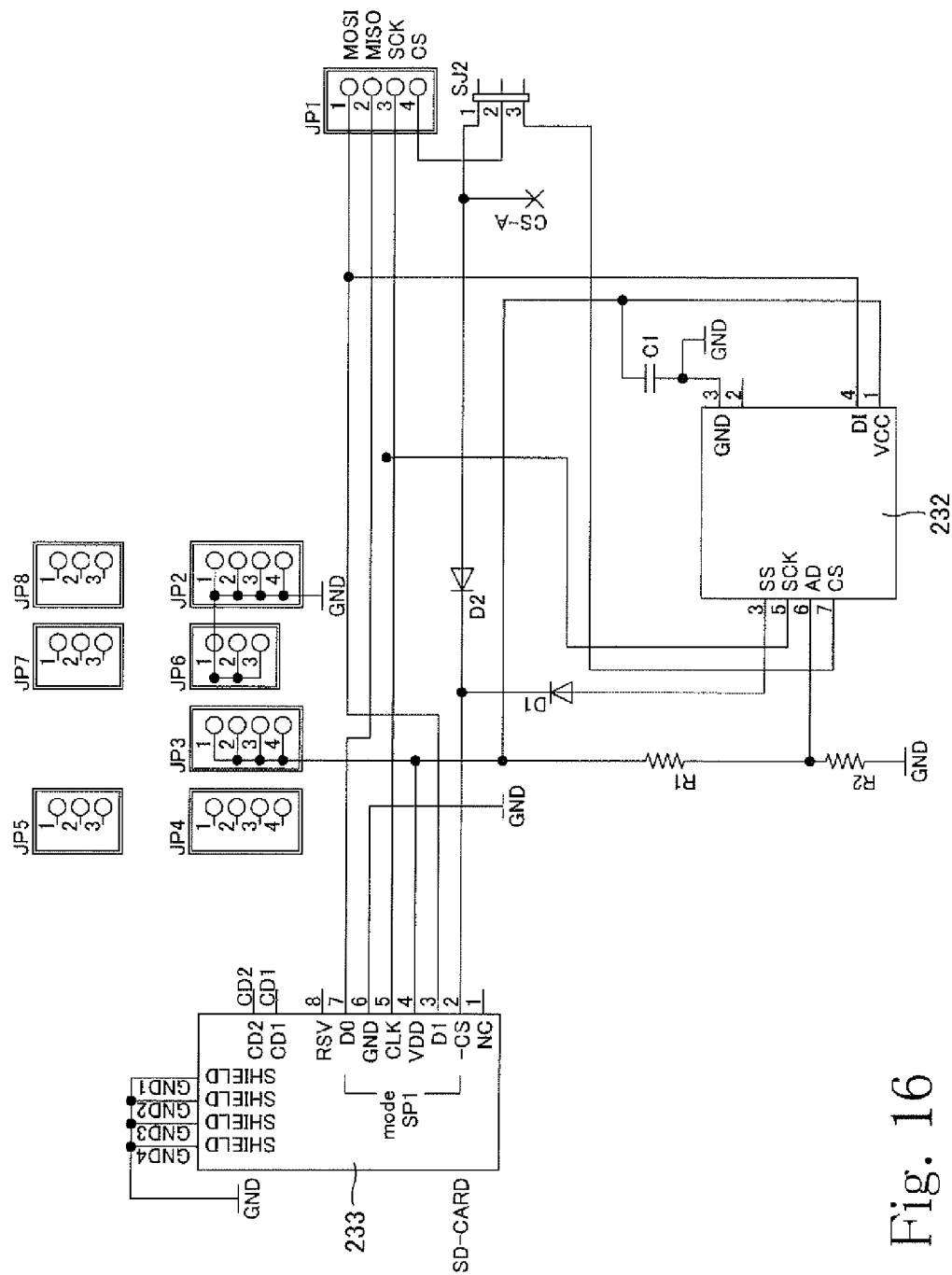
FIG. 16 is a circuit diagram illustrating an example SD card module board according to the present invention.
Figure 17:
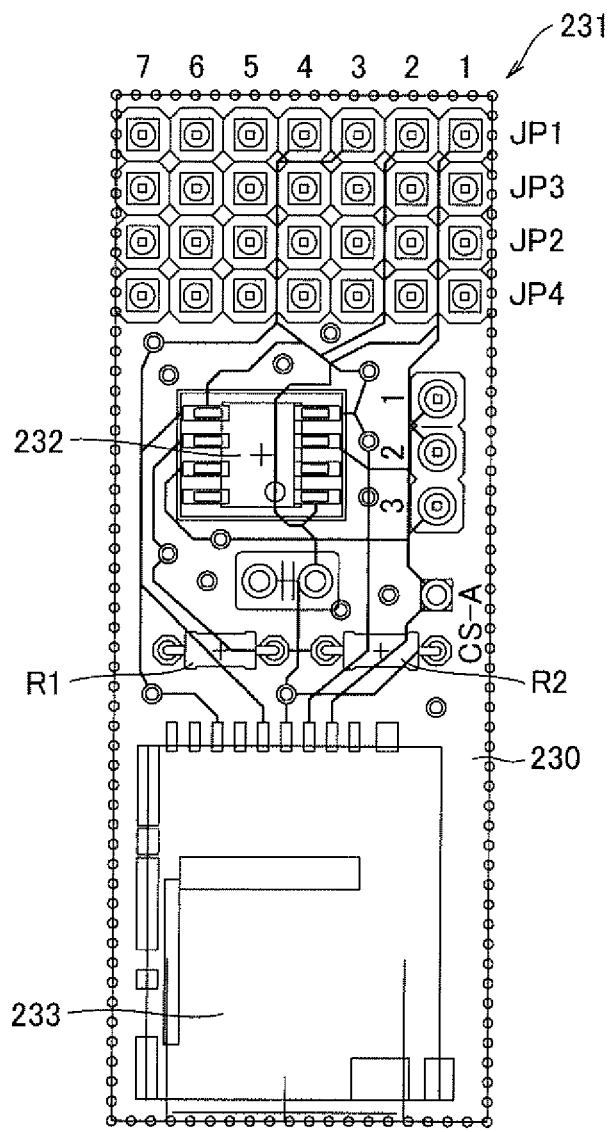
FIG. 17 is a plan view of the SD card module board.

FIG. 17 illustrates an example SD card module 230 supporting SPI communication. FIG. 16 illustrates the electrical connection of the triplets and quadruplets of terminals of a second connector 231 provided on the board of the SD card module 230, a chip select IC 232, and an SD card 233. As is well known, an SPI is a synchronous serial communication system between a master and multiple slaves through three signal lines consisting of a clock line SCK, a unidirectional data writing line SO, and a data reading line SI, and a chip select (CS) line or slave select (SS) line is added for selection of a specific slave from the slaves.

The chip select IC or designation determining element 232 of the SD card module 230 supporting SPI communication illustrated in FIGS. 16 and 17 receives a 3.3 V source voltage divided by resistors R1 and R2. The voltage corresponds to the designated address number of the module. If the voltage applied to the designation determining element 232 is 0 V, the SD module 230 enters an inactive mode. To activate the SD module 230, pins 2 and 3 of jumper line SJ2 illustrated in FIG. 16 are shorted such that a voltage other than 0 V is applied to the designation determining element 232. This SD card module 230 can be selected by activating the chip select (CS) pins (four terminal of JP1 illustrated in FIG. 16) and designating a relevant voltage or address value through SPI communication. This operation activates the SD card 233. The conventional chip select function can be used by shorting pins 1 and 2 of the jumper line SJ2.

Figure 20:
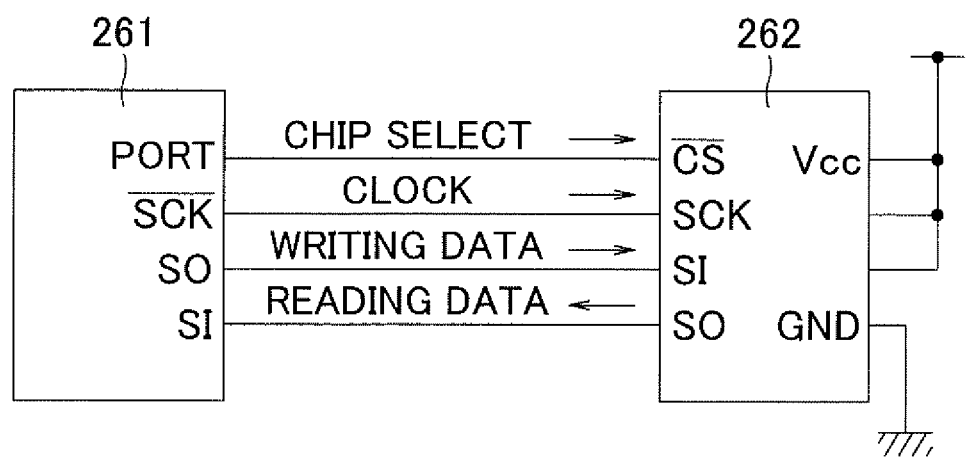
FIG. 20 is a block diagram illustrating a typical configuration for SPI communication.

As described above, multiple extension modules can be stacked. Such a stack and a baseboard 100 are combined to achieve further complicated functions. For a stack of extension modules supporting SPI communication, transmission of a signal for selecting a predetermined extension module is required for activation of the extension module. FIG. 20 schematically illustrates SPI communication. A master 261 and a slave 262 are connected by four signal lines consisting of a chip select signal line, a clock signal line, a data writing line, and a data reading line. A chip select signal is sent from the master 261 to the slave 262 to select a specific slave. A clock signal is sent from the master 261 to the slave 262 to synchronize the operation of the master 261 with the slave 262. A signal containing data to be written is sent from the master 261 to the slave 262. A signal containing data to be read is sent from the slave 262 to the master 261.

A stack of multiple extension modules supporting SPI communication does not function unless a select signal is sent from the baseboard to specify a selected extension module and activate the selected extension module. Conventional multiple devices supporting SPI communication scheme generally includes connecting device designating I/O lines to the chip select terminals of the devices. Unfortunately, this scheme requires connection of the device designating I/O lines to the chip select terminals, which does not meet the object of the present invention. Accordingly, the present invention provides the following configuration for specifying an extension module:

(1) Stacking output terminal module for chip select;
(2) Identifying extension module through single pin connected to single signal line;
(3) Selection by combination of I2C and SPI communication; and
(4) Designation of module through communication bus.

The methods of specifying an extension module will now be described in detail.

(1) Stacking Output Terminal Module for Chip Select

Figure 22A:
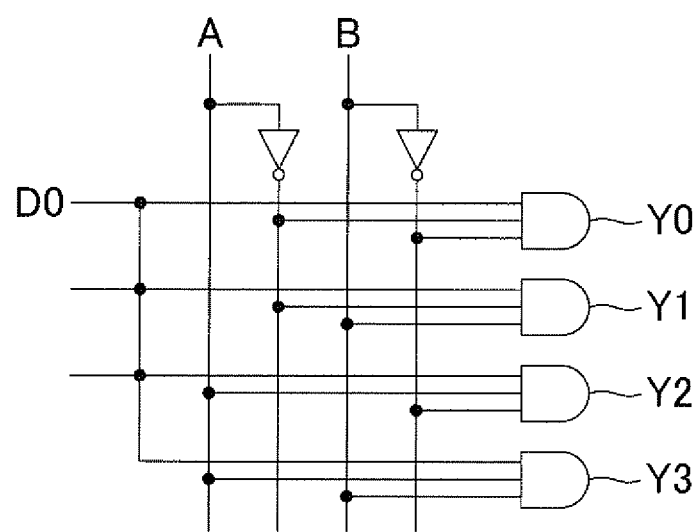
FIG. 22A is a circuit diagram illustrating an example demultiplexer.

An output terminal module for chip select distributes a digital output of the baseboard to connectors on the module and connects these connectors to chip select pins on other stacked modules. An example of such a module using a demultiplexer will now be described. As illustrated in FIG. 22A, a demultiplexer is a logic circuit consisting of a single input terminal for data D0, several input terminals for select control signals A and B, and multiple output terminals Y0, Y1, Y2, and Y3. The input data D0 is sent to one of the output terminals Y0, Y1, Y2, and Y3 in accordance with the input values of the select control signals A and B.

Figure 21A:
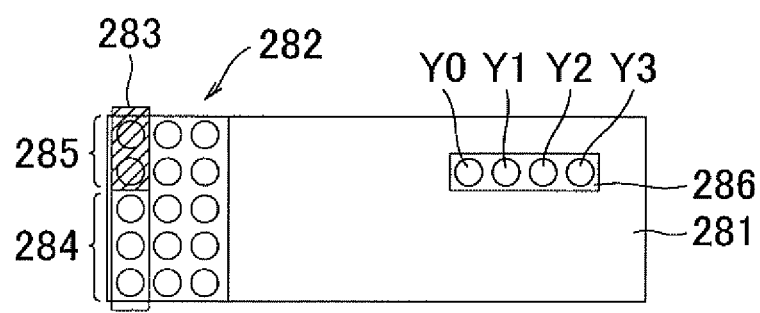
FIG. 21A is a plan view of an example SPI communication module board for the stacking of multiple extension modules or SPI communication module boards.
Figure 21B:
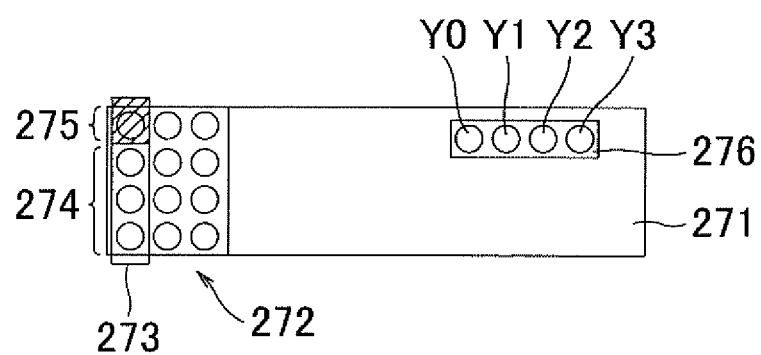
FIG. 21B is a plan view of the SPI communication module boards for a demultiplexer for the designation of the SPI communication module.

FIG. 22B illustrates a truth table of the demultiplexer. FIG. 21A illustrates an output terminal module for chip select using a demultiplexer. FIG. 21B is a schematic view of an SPI module stacked on the output terminal module for chip select. Signals are sent to the terminals Y0 to Y3 of a connector 286 from signal lines connected to the two terminals 285 illustrated in FIG. 21A via a demultiplexer circuit. The signal pin of D0 in FIGS. 22A and 22B receive a fixed signal from a power source in the module. The module illustrated in FIG. 21A and the module illustrated in FIG. 21B are vertically arrayed to electrically connect the connectors 284 and 274 and the connectors 286 and 276.

The SPI module illustrated in FIG. 21B is equipped with a jumper or switch that electrically connects a single terminal 275 and one of terminals Y0 to Y3 of a connector 286 illustrated in FIG. 21A. If the terminal 275 is selected as an input, the terminal 275 is directly connected to the baseboard, without using the output terminal module for chip select or without stacking another module. If the SPI module is stacked, the output terminal module for chip select is connected to a chip select pin of an SPI element through an electrical connection with one of the terminals Y0 to Y3 of a connector 276 of the output terminal module for chip select. Mechanically, the module 281 illustrated in FIG. 21A is connected to the baseboard; the module 271 illustrated in FIG. 21B is stacked on the module 281 illustrated in FIG. 21A; and corresponding connectors of the modules are connected. The embodiments illustrated in FIGS. 21A and 21B enable the selection of a predetermined chip in a stack of four modules at a maximum by two signals sent from the baseboard (signals from the two terminals 285 on the module illustrated in FIG. 21A) via the output terminal module for chip select.

Figure 23:
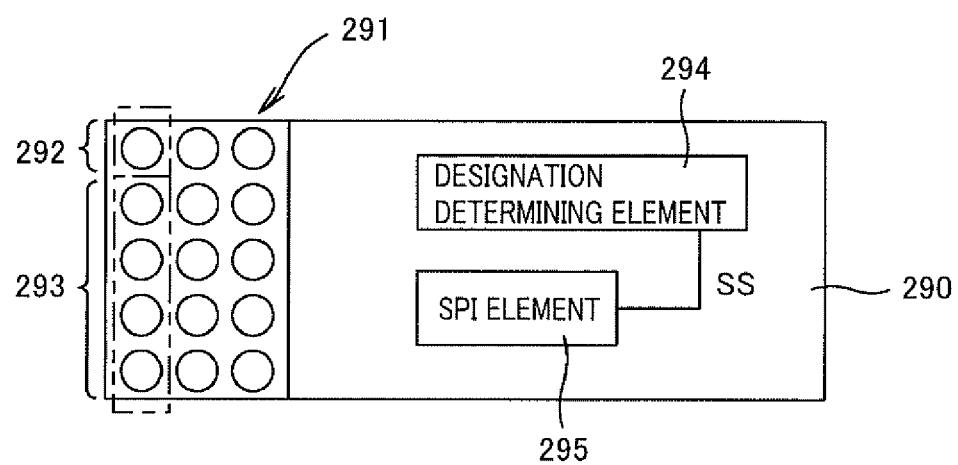
FIG. 23 is a simplified plan view of an example SPI communication module for designating an SPI communication module with a single pin signal to stack multiple extension module or multiple boards of an SPI communication modules.

(2) Identifying Extension Module Through Single Pin Connected to Single Signal Line This configuration includes selection of a module by a pulse width signal, such as an RC servo signal, a combination of pulse width signals, or a digital to analog (D/A) signal. FIG. 23 schematically illustrates an SPI module 290 that identifies a module in accordance with this configuration. Second terminals 291 provided on the SPI module 290 includes four signal terminals, one of the signal terminals being referred to as a signal terminal 292 for an SPI module designation. The signal terminal 292 is connected to a designation determining element 294. If the designation determining element 294 determines the designation of the SPI module 290, the designation determining element 294 activates a signal pin SS (slave select) of the SPI module 290 to designate the SPI device 295. One SPI module 290 in a stack of the SPI modules is designated on the basis of the pulse width, voltage, or a combination of pulse width and voltage of the signal from the signal terminal 292. Deactivation of SS pins with a specific address at one is convenient. The other three signal terminals 293 of the four second terminal 291 inputs and outputs signals SCK, MISO, and MOSI for SPI communication.

Multiple SPI modules 290 may be stacked and connected in series. One of these SPI modules 290 can be selected by a signal from the signal terminal 292. If the SPI modules 290 have designated addresses in advance, the SPI modules 290 can be connected in series, such as the I2C modules. The address of a module may be stored in a microcomputer in advance. Alternatively, the module may be designated using a jumper line or switch, a ROM, a resistance, or a voltage divided by resistors.

For reception of signal designating one of the SPI modules 290, it is preferred that microcomputers storing programs be installed as the designation determining elements 294 to designate SS or CS pins in the modules in accordance with the signals sent to the single pins (terminals 292) in the modules. The SPI modules preferably support such a configuration. A circuit may be provided that activates/deactivates an SS (CS) pin in accordance with the intensity of an analog signal or signal level. The address of an SPI module may be designated by any of the procedures described above. Signals are transmitted between the designated SPI module 290 and the baseboard via the three signal terminals 293 illustrated in FIG. 23.

The functions of the module identified through the method according to section (2) may be provided on a single chip.

(3) Selection by Combination of I2C and SPI Communication

Figure 24:
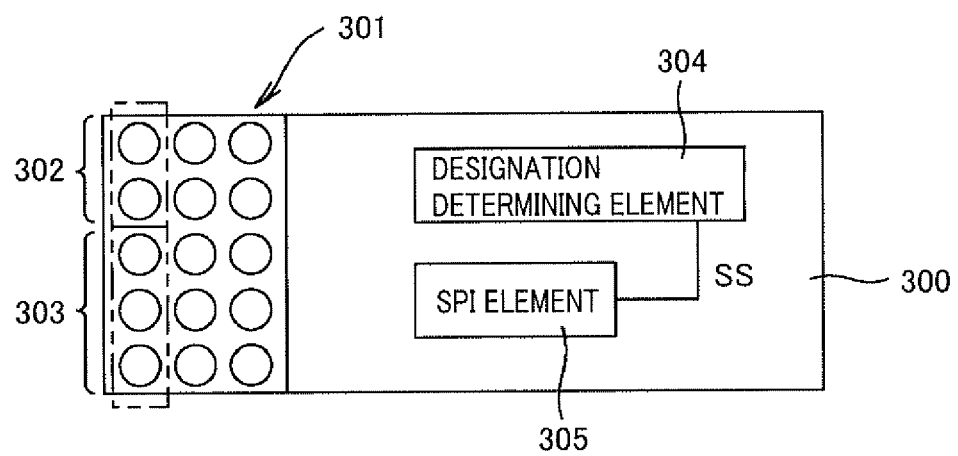
FIG. 24 is a simplified plan view of an example SPI communication module for designating an SPI communication module through I2C communication to stack multiple extension module or multiple boards of an SPI communication modules.

In this configuration, an I2C module designates the address of an SPI module to be activated and carries out SPI communication with the designated module. FIG. 24 schematically illustrates an SPI module 300 having the configuration described above and carrying out identification. A second connector 301 of the SPI module 300 includes five signal terminals, including two I2C signal terminals 302 for SPI module designation. The other three are signal terminals 303 for input/output of SPI signals. The SPI module 300 is also equipped with a device 304 that supports the I2C scheme.

Similar to the configuration according to section (2), multiple modules can be connected in series via the signal terminals 302 and 303. SPI modules 300 can be stacked and connected in series. One of these SPI modules 300 can be selected based on signals sent from the signal terminals 302. If the address of an SPI module is designated in advance (for device designation) in the SPI modules 300, the SPI modules can be simply connected in series, such as I2C modules, without consideration of the signal lines such as chip select (CS) lines. The address of an SPI module may be designated by any of the procedures described above. The functions of the module identified through the method according to section (3) may be provided on a single chip.

(4) Designation of Module Through Communication Bus

Figure 25:
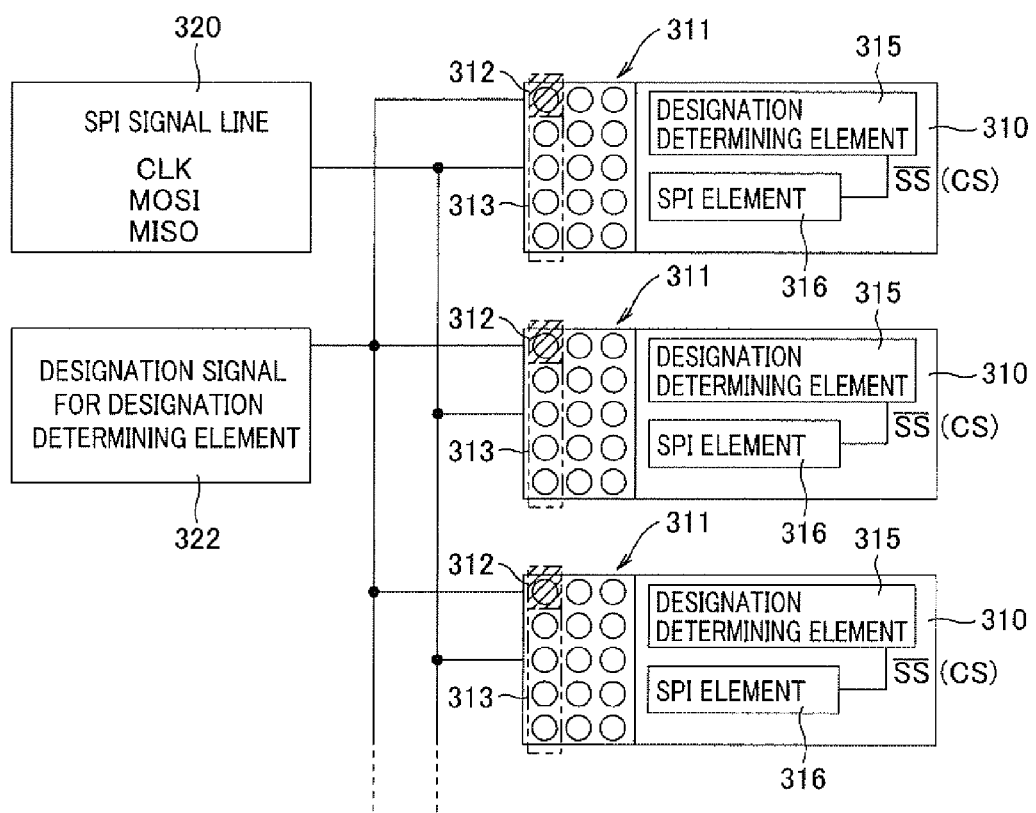
FIG. 25 is a schematic circuit diagram of an example SPI communication module for designating an SPI communication module through a communication bus to stack multiple extension module or multiple boards of an SPI communication modules.

In this configuration, a module is designated through an SPI communication bus. FIG. 25 illustrates SPI communication modules and signal input/output of the modules. In this example, at least three SPI communication modules 310 are provided, each module 310 including a second connector 311, a designation determining element 315, and an SPI element 316. The second connector 311 consists of five quadruples of terminals. Each quadruplet includes a designation-signal input terminal 312 for designation of a designation determining element 315 and other four input/output terminals 313 for SPI signals. The designation-signal input terminal 312 for designation of a designation determining element receives a designation signal for designation of a designation determining element from the baseboard 100; the designation determining elements 315 of the modules 310 carry out SPI communication to match the signal to the address established in the respective modules and determines the designation of the modules 310; then the designation determining elements 315 activate or deactivate the SS pins of the SPI elements 316. An SPI signal line 320 input/outputs signals CLK, MOST, and MISO corresponding to the three terminals 313 of each module 310 to the three terminals 313. The designation determining element 315 and the SPI element 316 of the designated module 310 are activated in accordance with these signals.

Each designation-signal input terminal 312 in FIG. 25 is connected only to the respective designation determining element 315 and is not connected to the SPI element 316. The designation determining element 315 and the SPI element 316 are connected to an SPI bus (clock, input data, output data) of the three terminals 313. The designation determining element 315 is connected to the slave select SS line (or chip select CS line) of the SPI element 316.

The designation determining elements 315 of all modules 310 in the stack receive address data by SPI communication from the baseboard and match the address data to the addresses registered in advance. If the addresses match, the corresponding designation-signal input terminal 312 is deactivated while the corresponding designation determining element 315 activates the SS line (CS line) of the corresponding SPI element. Upon reactivation of the designation-signal input terminal 312, the designation determining element 315 deactivates the SS line (CS line) of the respective SPI elements 316. Subsequently, designation determining elements of all modules in the stack enter a stand-by mode for SPI data input from the baseboard and repeats the process described above.

If extension modules are stacked, the baseboard carries out simultaneous SPI communication with multiple designation determining elements 315 when the designation-signal input terminals 312 of the extension modules 310 are activated. Responses from the extension modules 310 to the baseboard require appropriate resistors and diodes for prevention of short-circuiting between the terminals that output data via the designation determining elements 315 by SPI so that the terminals that output data through SPI communication of the designation determining elements 315 are not shorted.

In the example illustrated in FIG. 25, three SPI signal lines consisting of a CLK line, an MOST line, and a MISO line enables bidirectional communication between the baseboard and the extension modules 310. Unidirectional communication from the baseboard to the extension modules 310 requires only the two lines other than the line for the data output signal from the extension modules.

The procedures of signal processing according to section (4) will now be described. The designation-determining-element designation signal lines connected to the designation-signal input terminals 312 for the designation determining elements are activated and the chip select lines SS (CS) of all SPI elements 316 are deactivated to allow SPI communication with only the designation determining elements 315 of all extension modules 310 in the stack. In this state, a module designation signal is sent to the designation determining elements 315 by SPI communication. The designation signal, for example, contains an I2C address. Reservation is completed for activation of the SPI element 316 of the designated module 310. At this point, the SS (CS) pins of the SPI elements 316 of all modules 310 in the stack are deactivated. Returning an echo through SPI communication from the designation determining element 315 of the designated module 310 facilitates error correction.

The designation reservation of a specific module 310 by the designation determining element causes the designation determining element 315 to activate the SS signal of the reserved module 310 corresponding to the designated address upon deactivating the designation-determining-element designation signal lines, and the SPI element 316 connected to the three terminals 313 can establish SPI communication with the baseboard. Then, the SPI element 316 of the designated SPI module 310 carries out SPI communication with the baseboard 100 to read and write signals. The address of an SPI module may be stored in a microcomputer in advance. Alternatively, the module may be designated using a jumper line or switch, a ROM, a resistance, or a voltage divided by resistors. Upon reactivation of the designation-signal input terminals 312, the designation determining element 315 deactivates the SS (CS) line of the SPI element 316. Subsequently, the procedures described above are repeated, and the designation determining elements 315 of all modules 310 in the stack enter a stand-by mode for SPI data input from the baseboard. The functions of the module identified through the method according to section (4) may be provided on a single chip.

As described above, the structure for connecting the baseboard and extension modules according to embodiments of the present invention establishes connection between the baseboard and the extension modules by mere connection of the first connector of the baseboard to the second connector on the extension module. Thus, the structure for connecting the baseboard and the extension modules is simplified, and the connection operation is facilitated. The extension module can be replaced by simply removing the extension module and inserting another extension module having a different specification. Thus, the specification of the extension modules can be readily changed, and faulty wiring can be significantly reduced.

The ground terminal and the source terminal of an extension module are connected to the ground line and the source line, respectively, via the first and second connectors. The ground line and the source line are connected to the ground line and the source line of the baseboard, respectively. The signal lines of the baseboard and the extension module are connected via the signal terminals of the first and second connectors. Standardization of the ground terminals, the source terminals, and the signal terminals enhances the versatility of the structure for connecting a baseboard and extension modules.

In the baseboard 100 according to the embodiments illustrated in the drawings, the arrangements of the terminals are not limited to those illustrated in drawings of the rows of the ground terminals 111, 121, and 142, the rows of the source terminals 112, 122, and 143, and the rows of the signal terminals 113, 123, and 144 of the first connectors 110, 120, and 140, respectively, and the row of the source terminals 141 of the first connector 140. Rearrangement of the rows of the source terminals, for example, allows connection of a commercially available connector for RC servo. Multiple first connectors having different arrangements of the rows of ground terminals, source terminals, and signal terminals may be provided. The second connector of an extension module to be connected to the first connector should have a specification corresponding to the first connector. That is, the first connector and the second connector each should at least include a ground terminal connected to a ground line, a source terminal connected to a source line, and a signal terminal connected to a signal line.

Figure 26:
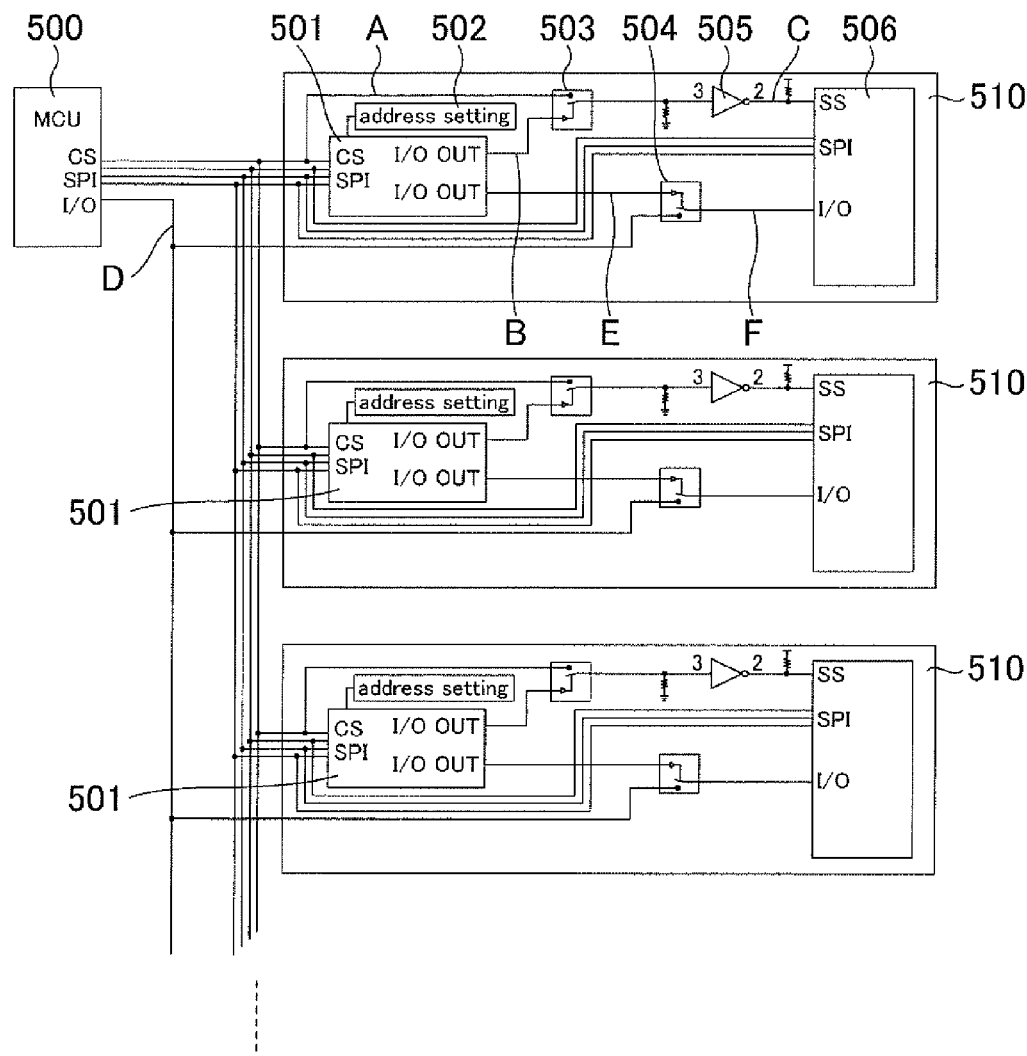
FIG. 26 is a circuit diagram of an example signal processing circuit for a stack of multiple extension modules.

Signal processing carried out in a stack of multiple extension modules, described above, will now be described. FIG. 26 illustrates an example signal processing circuit having extension modules or multiple SPI modules 510. Each extension module 510 includes a designation determining unit 501 or SPI I/O expander and an SPI device 506. Each designation determining unit 501 includes an addressing unit 502. The designation determining unit 501 includes SPI signal terminals or MISO, MOST, and SCK signal terminals. These terminals are connected to the respective MISO, MOST, and SCK terminals in a microcomputer 500. The microcomputer 500 is equipped with a chip select signal terminal CS and a signal input/output terminal I/O, as normal input/output terminals. The terminal CS is connected to a CS terminal of the designation determining unit 501 and switchable terminals in the switching circuits 503.

The designation determining unit 501 has multiple output terminals. One of the output terminals is connected to the switching circuit 503 to send a control signal. The switching circuit 503 operates as a gate; the switching circuit 503 electrically connects the CS terminal and the SS terminal on the basis of a control signal B from the designation determining unit 501, and a signal A sent from the terminal CS of the microcomputer 500 to the switchable terminal of the switching circuit 503 passes through the switching circuit 503. An inverter 505 is connected to downstream of the switching circuit 503. A signal C inverted by the inverter 505 is sent to the SS terminal of an SPI device 506.

The other output terminal of the designation determining unit 501 is connected to the switchable terminal of the other switching circuit 504. A signal E is sent from the output terminal of the designation determining unit 501 to the switchable terminal. An output signal D for the signal input/output terminal I/O of the microcomputer 500 is sent to the control terminal of the switching circuit 504. The electrical connection between the CS terminal and the SS terminal established by the switching circuit 504 based on a signal E from the designation determining unit 501 causes the signal D to enter the signal input/output terminal I/O of the SPI device 506. The SPI signal terminal of the microcomputer 500 is connected to the SPI signal terminals of the SPI devices 506.

All designation determining units 501 are activated by the output of a chip select signal CS by the microcomputer 500. The microcomputer 500 transmits an SPI signal designating one of the SPI modules 510. The designation determining unit 501 of each module determines the SPI signal as a signal designating itself by comparing the SPI signal with an address signal established in an addressing unit 502 in advance. If the SPI signal designates itself, the designation determining unit 501 outputs the command as the SPI signal from its output terminal. One of these output signals B opens the gate of the switching circuit 503 and allows the signal A or CS signal to pass therethrough. Then, the ON state of the signal B is maintained unless there is a change in the designation of the input/output terminal I/O through communication or the designation state is reset. The signal that has passed through the switching circuit 503 is converted into an inverted signal C in the inverter 505. The signal C is sent to the SS terminal of the SPI device 506 of the relevant SPI module 510.

In this way, upon activation of the designation determining unit 501 by the microcomputer 500, the SPI device 506 is deactivated. If the signal CS of the designation determining unit 501 is disconnected while the connection of the microcomputer 500 is authorized by the designation determining unit 501, the SPI device 506 is activated. The activated SPI device 506 has a specific function based on a command signal from the microcomputer 500. Table 1 provided below shows the chip select logic of an SPI device.

TABLE 1

| Chip Select Logic of SPI Device | | | | |
|---|---|---|---|---|
| Signal A | + | + | − (CS Activated) | − (CS Activated) |
| Signal B | + (Switch Connection) | − | + (Switch Connection) | − |
| Signal C | − (SS Activated) | + | + | + |

In general, a normal I/O signal is used as a chip select signal CS. Alternatively, the SS terminal may be directly controlled by a signal from the designation determining unit 501.

A single module may be equipped with multiple devices that operate by the chip select signal (CS). Similar to the switching circuit described above, a switching circuit for ON/OFF control may be attached to a communication bus for the devices (such as microcomputers) of an extension module.

The SPI device 506 may require an input/output terminal in addition to the terminals connected to the SPI bus line and the chip select line. This may also be established in a similar manner as the chip select type described above. Usually, a chip select signal terminal is not a special terminal, and an input/output terminal of a microcomputer is used. That is, any type of typical input/output terminal of the microcomputer may be used.

In the embodiment illustrated in FIG. 26, an output signal E from a designation determining unit 501 or I/O expander controls the connection of an I/O line from a microcomputer 500 through a second switching circuit 504 including a relay, a logic circuit, and an analog switch to an input/output terminal I/O of an SPI device 506. The difference with the chip select of the switching circuit 503 described above is the inverter 505. The circuitry is simpler in which the signal E from the designation determining unit 501 authorizes the electrical connection between a signal D and a signal F.

Figure 27:
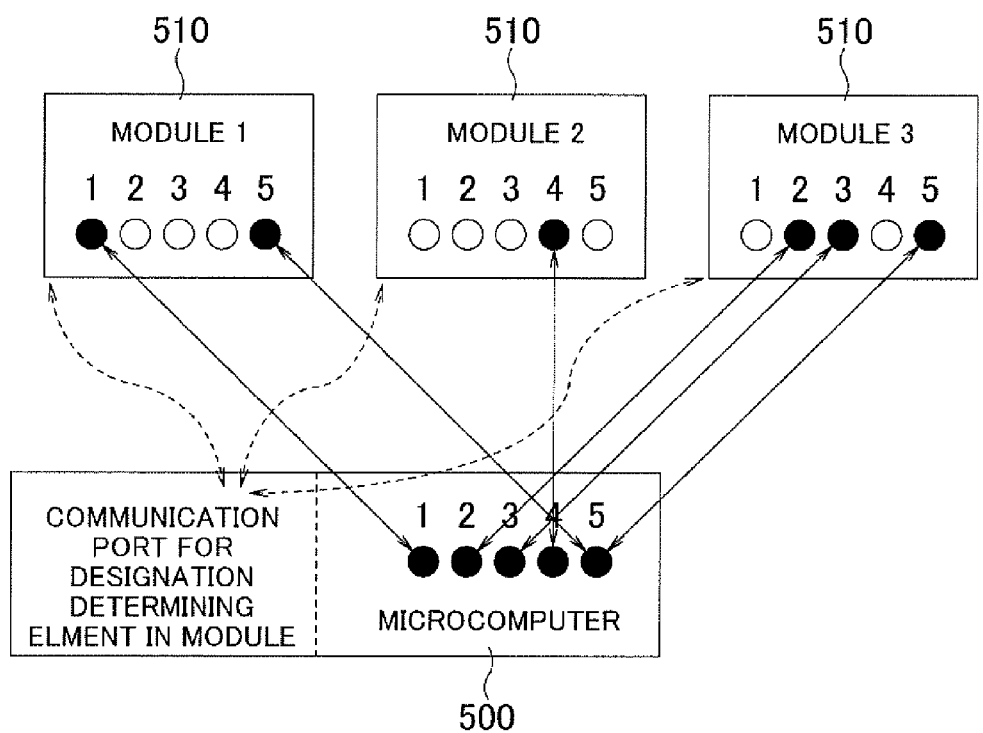
FIG. 27 is a schematic view of the results switching among multiple devices of multiple extension modules in the example signal processing circuit.

As described above, signals from the signal terminals of the microcomputers 500 of extension modules in a stack can be switched between multiple devices for connection. FIG. 27 is a schematic view of the results of such execution. FIG. 27 illustrates multiple input/output terminals of a microcomputer 500 or, for example, five microcomputer 500 numbered from Nos. 1 to 5, and multiple extension module 510 or, for example, three extension modules. The first extension module 510 allows connection of terminals Nos. 1 and 5 and the microcomputer 500 as a result of the operation of a designation determining unit or I/O expander. Similarly, the second extension module 510 allows connection of the terminal No. 4 and the microcomputer 500, while the third extension module 510 allows connection of the terminals Nos. 2, 3, and 5 and the microcomputer 500. Thus, in this example, the terminal No. 5 can input/output the same signal to/from multiple modules simultaneously. In FIG. 27, the dotted arrows indicate communication between the microcomputer 500 and the extension modules 510 for controlling the designation determining units in the extension modules 510.

In the embodiments illustrated in FIGS. 26 and 27, a change in the state of the designation determining units or I/O expanders on the extension modules 510 allows switching of a specific terminal to a terminal of another extension module during operation of the microcomputer 500 to establish direct communication by the multiple extension modules connected in series and the device of the extension module via the terminal of the microcomputer 500.

The signal transmitted between the baseboard and the extension modules is not limited to a unidirectional digital signal and, alternatively, may be an analog signal. The analog or digital signal may be a bidirectional signal.

Figure 28:
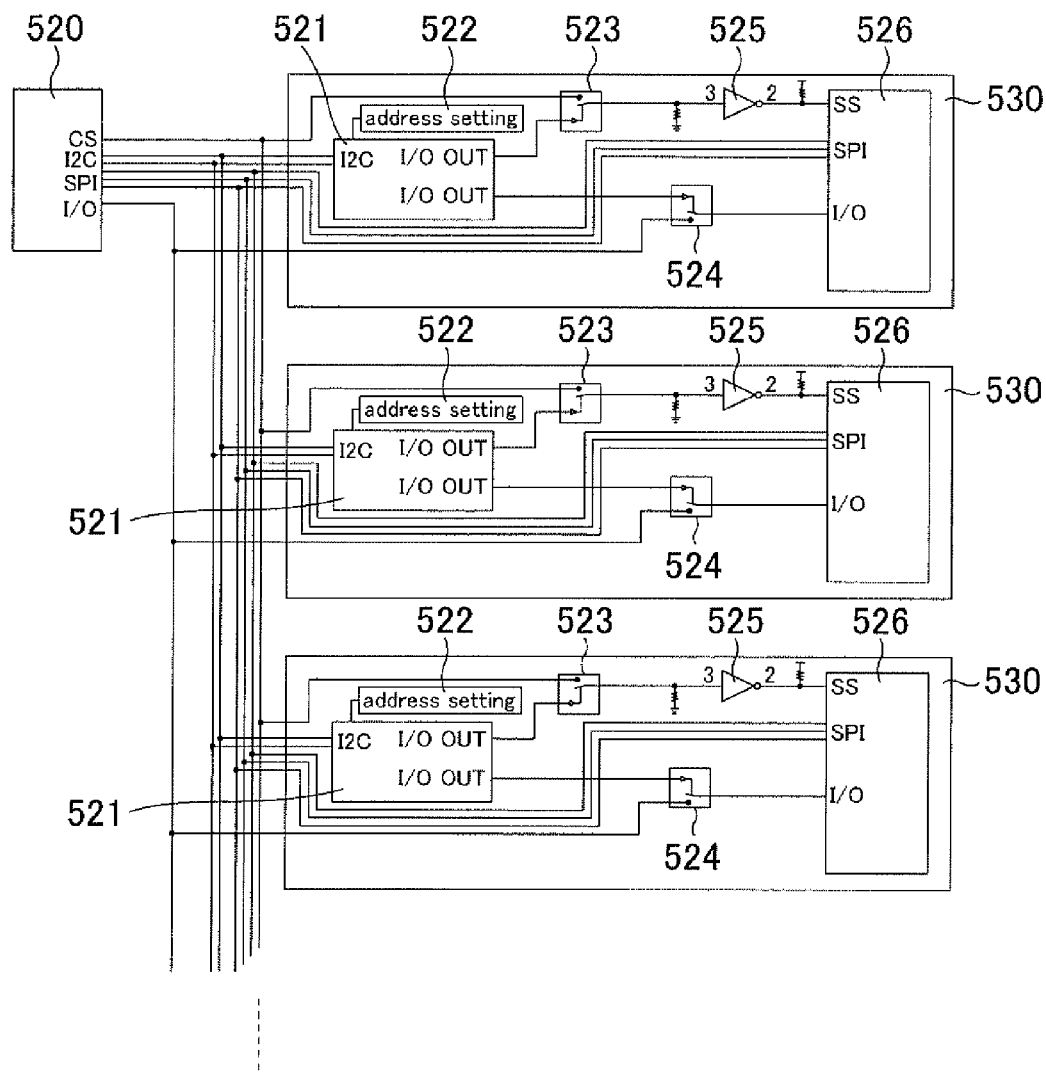
FIG. 28 is a circuit diagram of another example signal processing circuit in a stack of extension modules.

The designation determining unit or SPI I/O expander according to this embodiment may be replaced with any other communication system, in particular a system that can be connected in series. For example, the I2C I/O expander illustrated in FIG. 28 may be used. In FIG. 28, multiple extension modules 530, which are connected in series, are controlled by a single microcomputer 520. The extension modules 530 each include an I2C I/O expander or designation determining unit 521, an addressing unit 522, a first switching circuit 523, a second switching circuit 524, an inverter 525, and an SPI device 526. This embodiment differs from that illustrated in FIG. 26 in that the microcomputer 520 and the I2C I/O expander or designation determining unit 521 are connected via an I2C bus, and the other configurations are the same. The designation determination of an extension module 530 by the microcomputer 520 is practically the same as that according to the embodiment illustrated in FIG. 26; thus, description thereof is omitted.

The interface connected to the designation determining units may be an I2C, a CAN, a serial interface, a LAN, a wireless interface, an original communication mode, or any other type of interface that allow the designation determining units to function. In this way, the individual designation determining units can be controlled by a mechanical connection of the extension modules in series. The address of the designation determining units may be established using any means, such as an external circuit or an IC memory, that allow the designation of a specific value.

As described above, although a communication system using the designation determining unit does not rely on a specific connection mode, such as the shape of the connectors and the configuration of the stack, it is significantly advantageous for a structure for connecting stacked boards in series.

The connections of the signal lines illustrated in FIGS. 26 and 28 can be put into practical use in combination with multiple extension modules having voltage holding circuits and current holding circuits, such as peak hold circuits. In this way, the voltage and the current can be maintained for analog terminals of unselected extension modules during switching of the terminal authorized by a selected extension module to a terminal of another extension module. Continuous DA output and AD input from/to multiple modules can be carried out with a single digital-to-analog (DA) terminal or a single analog-to-digital (AD) terminal of a microcomputer. The voltage holding circuit and the current holding circuit may be reset by an input/output terminal of an I/O expander or an input/output terminal of a microcomputer.

Any type of periodic signal, regardless of digital or analog, can be used in combination with a circuit holding the signal. In this way, the signal state can be maintained during switching.

Figure 29:
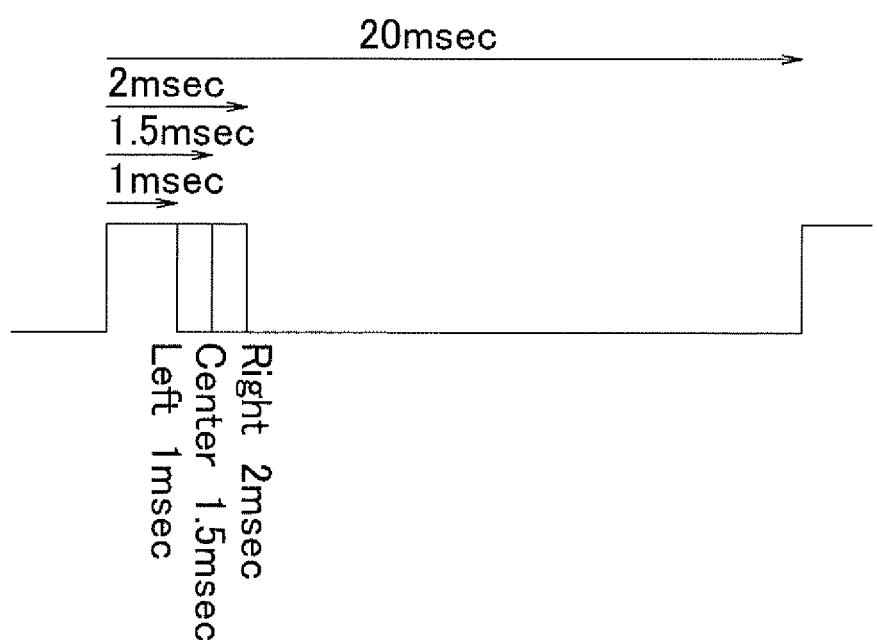
FIG. 29 is a timing chart illustrating an example control operation in a case where a servo device is used as an extension module.
Figure 30:
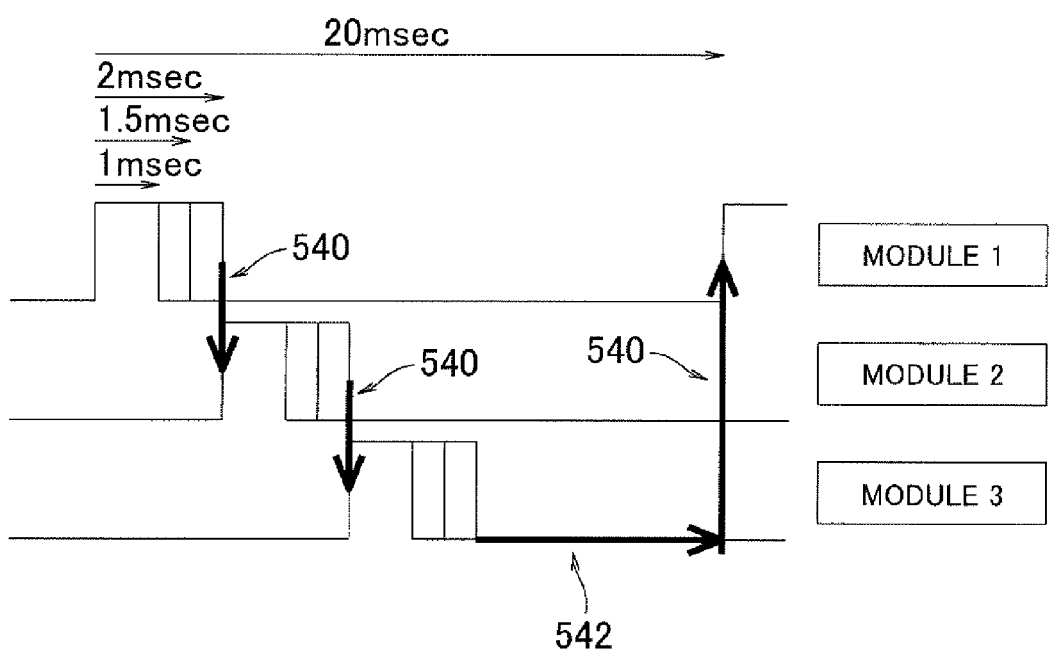
FIG. 30 is a timing chart illustrating an example control operation in a case where a servo device is used as an extension module.

An extension module or device controlled by pulse width modulation (PWM) signals will now described, such device being a servo device used for an RC device or a plurality of servo devices. FIG. 29 illustrates a single servo device. FIG. 30 illustrates multiple servo devices or, for example, three servo devices. In either case, the servo devices may be composed of extension modules without dedicated circuits and special elements.

As illustrated in FIG. 29, the operation for one channel is carried out, for example, in two milliseconds during each 20-millisecond cycle. The identification is carried out in the first millisecond, while the angle of the RC servo is controlled within the pulse width of the second millisecond. For example, the trailing edge of a pulse occurring within 1 to 1.5 milliseconds from the beginning of the first 20-millisecond cycle turns the servo device to the left; the trailing edge of the pulse occurring at 1.5 milliseconds after the beginning of the first 20-millisecond cycle leaves the servo device neutral or unmoved; and the trailing edge of the pulse occurring between 1.5 to 2 milliseconds after the beginning of the first 20-millisecond cycle turns the servo device to the right.

FIG. 30 illustrates three servo devices as extension modules. During a 20-millisecond cycle, as described above, the servo devices are sequentially switched to continuously repeat the control illustrated in FIG. 29. Each servo device is controlled within two milliseconds, as illustrated in FIG. 29. After two milliseconds, the next servo device is controlled within another two milliseconds, and subsequently, another servo device is controlled within another two milliseconds. After the 20-millisecond cycle, the same control is carried out in the next cycle and is subsequently repeated. In FIG. 30, reference numeral 540 represents the switching timings from a module 1 to a module 2, from a module 2 to a module 3, and from a module 3 to a module 1. Reference numeral 542 represents a stand-by state after the operation of the module 3 during a cycle and before switching to module 1 at the end of the 20-millisecond cycle.

In this way, a terminal of a single microcomputer can control multiple RC servos. Circuit or elements, such as I/O expanders capable of PWM output, may be directly connected to the terminal of the microcomputer. The terminal of the microcomputer outputting a signal may be fixed in this state, and then signals from the microcomputer may be controlled at an appropriate timing by a signal from the I/O expander of the module via the switching circuit. In the embodiments illustrated in FIGS. 29 and 30, the normal and inverted operations of the servo devices are controlled at the timing of the trailing edge of the pulsed signal. The operation of the servo device may be controlled at the timing of the trailing edge of the pulsed signal.

Upon switching of the extension modules, the function of a terminal of the microcomputer or a function of a terminal of the baseboard may be changed depending on the device to be connected. For example, one or more output terminals of an extension module may be used as input terminals on another extension module or a communication bus when the extension module is switched. In this way, the hardware design can be simplified considerably.

The operation and advantages of a structure for connecting a baseboard and an extension module according to the present invention will now be described.

A system is constructed by assembling boards with the connection structure according to the present invention. The circuit design can be modified merely by replacing some of the extension modules and rewriting programs, without replacement of all boards and parts at once. Since all boards and components do not require replacement at once, the final operation cost can be reduced. Customization of some functions of the circuits, update of the devices on the modules, and modification of some functions of input/output can be performed readily.

If the replacement of components is required due to damage of some extension module and/or non-compliance to the desired specification, only the damaged component and/or the component requiring a specification change need to be replaced. Thus, the components can be replaced at low cost. In addition, the components can be replaced merely by changing connectors, which saves time and effort.

A change in the specification of the microcomputer on the baseboard achieves optimal processing speed for the circuit configuration and optimal operating costs. In this way, various types of system products can be provided at low costs, and customized products can be provided readily. For even lower costs, the shape of the connectors, the position of the terminals of the communication bus, and other features should be standardized for the reuse of extension modules.

In an environment that may cause disconnection of connectors and extension modules due to vibration or other factors, it is preferred that the boards of all extension modules in a stack be firmly connected by forming mounting holes and inserting screws through these holes and then be fixed to a case. Fixing hooks may be provided for the connection between connectors and the connection between extension modules. An extension module can be replaced merely by reconnecting the connectors at designated positions and loading designated program. Thus, the replacement can be readily performed by someone who is not an engineer with advanced knowledge. The extension modules can be replaced by customers or local subcontractors by providing instructions for the modules to be replaced and the programs to be loaded. Thus, labor costs for operation can be reduced.

Figure 31:
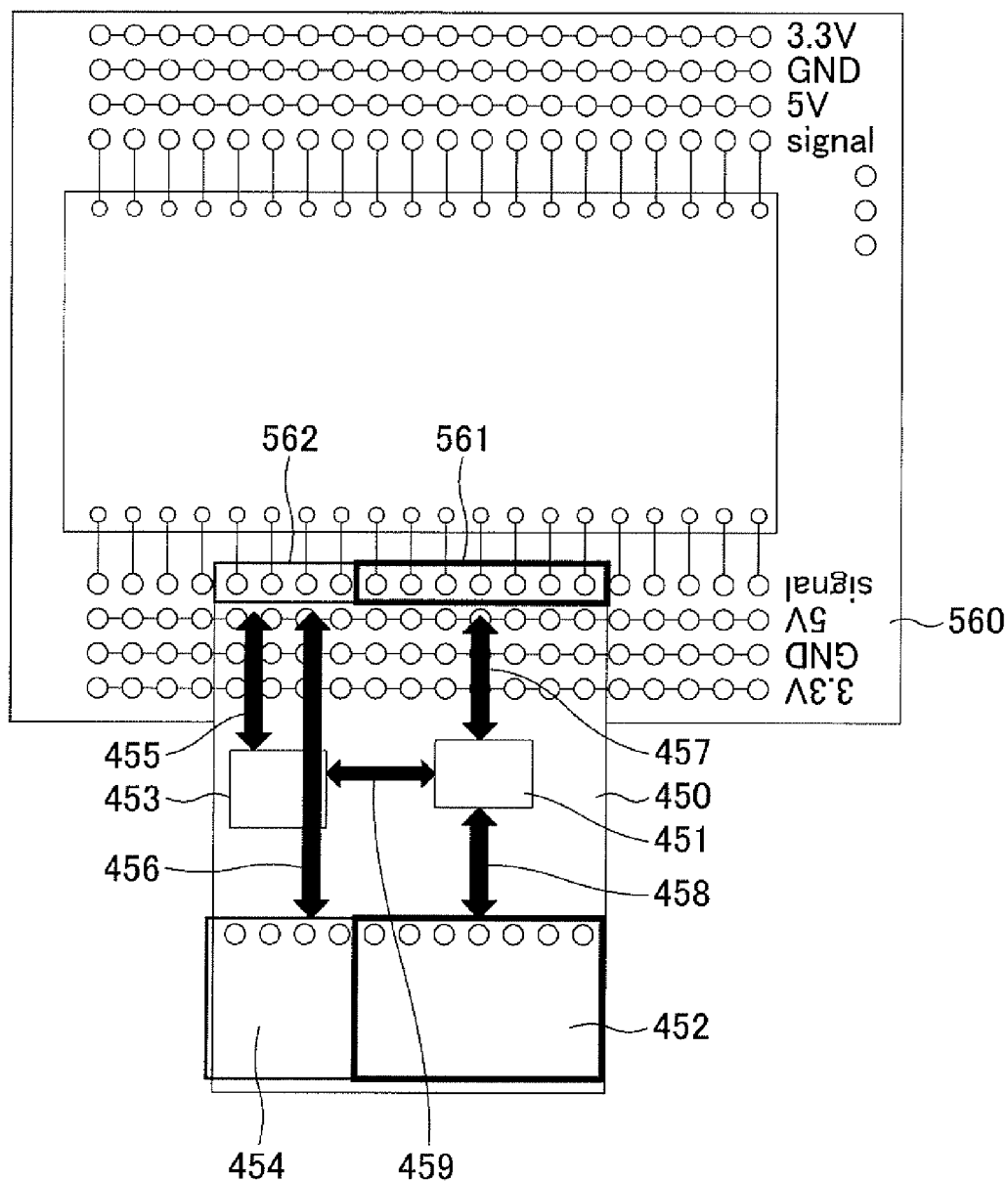
FIG. 31 is a schematic block diagram of an example connection of an extension module and a baseboard.

FIG. 31 is a schematic view of the connection between an extension module and a baseboard, which are described above. The baseboard 560 illustrated in FIG. 31 includes a row of 3.3 V source terminals, a row of ground terminals, a row of 5 V source terminals, and a row of signal terminals, along the longitudinal edges from the outside to the inside. The rows of terminals constitute a first connector, which is described above. One of the edges of the baseboard 560 is mechanically and electrically connected to an extension module 450 by fitting a second connector of the extension module 450 to the first connector. The second connector of the extension module 450 is fit together with the first connector of the baseboard 560 and overlaps the row of 3.3 V source terminals, the row of ground terminals, the row of 5 V source terminals, and the row of signal terminals.

As described above, the extension module 450 includes a designation determining unit 453, switching circuits 451, devices 452 having specific functions, and a device 454 including a communication bus that is the same as that of the designation determining unit 453. The extension module 450 includes a communication bus 455 for designation determination, a communication bus 456 connected to the designation determining unit 453 and the device 454 that operates with the same communication bus as the communication bus for designation determination, a signal line 457 connecting input/output terminals of a microcomputer of the baseboard 560 and the switching circuits 451, signal lines 458 connecting the switching circuits 451 and the devices 452, and signal lines 459 connecting the designation determining unit 453 and the switching circuits 451 to allow communication with the microcomputer. The device 454 and the devices 452 may be the same as the device 506 illustrated in FIG. 26.

In the embodiment illustrated in FIG. 31, the extension module 450 includes a second connector 561 consisting of seven terminals connected to seven specific signal terminals of the baseboard 560. The extension module 450 also includes seven switching circuits 451 corresponding to the seven terminals, the devices 452 corresponding to the seven terminals selected by the switching circuits 451, and the designation determining unit 453 that controls the seven switching circuits 451. In addition to the second connector 561, the extension module 450 has a second connector 562 consisting of four terminals connected to four specific signal terminals of the baseboard 560. The designation determining unit 453 identifies the signal sent from the signal terminals of the baseboard 560 via the second connector 562 and controls the corresponding switching circuits 451. The signal may be sent to the device 454 via the switching circuits, if required. The device may be directly controlled by signals from the designation determining unit.

Although multiple switching circuits 451 and multiple devices 452 are provided, FIG. 31 illustrates these components as single blocks for simplification of the drawing. The number of terminals of the baseboard 560 and the size of the extension module 450 are not limited those illustrated in FIG. 31. A desired function can be achieved by simply stacking and connecting extension modules 450 having the same or different configurations.

In the embodiment illustrated in FIG. 31, only a certain number of signal terminals aligned in a straight line on the baseboard 560 can be used by the designation determining unit 453 of the extension module 450. Thus, the correspondence between the signal terminals of the baseboard 560 and the signal terminals of the extension module 450 is limited. That is, the extension module 450 has to be connected at a specific position on the baseboard 560 in alignment with the communication lines for controlling the designation determining unit. A connection at an improper position will cause malfunction.

Figure 32:
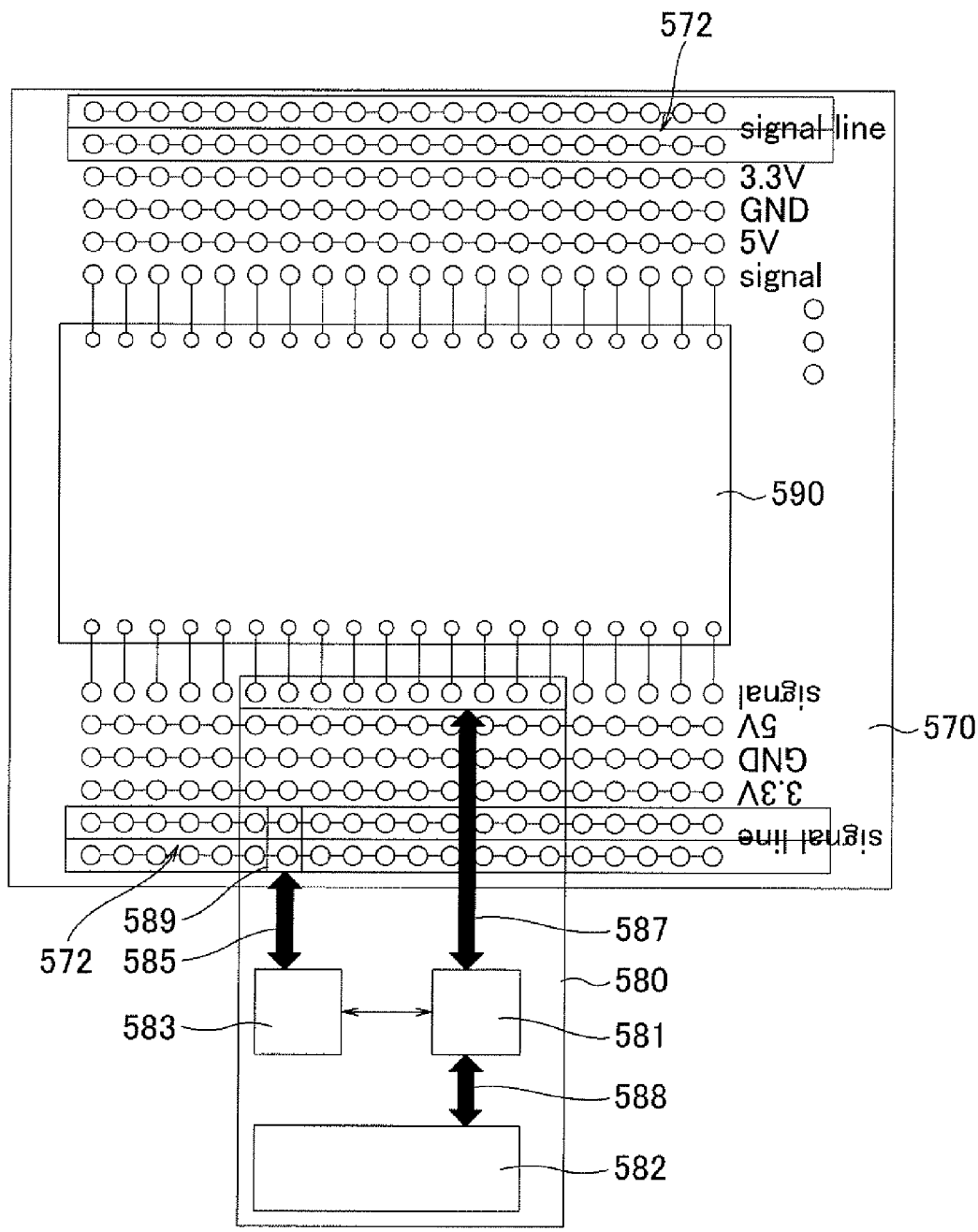
FIG. 32 is a schematic block diagram of another example connection of an extension module and a baseboard.

As illustrated in FIG. 32, an additional row 572 of signal terminals that can be used for communication with a designation determining unit may be provided on a baseboard 570 including a row of 3.3 V source terminals, a row of ground terminals, a row of 5 V source terminals, and a row of signal terminals, as described above. The additional row 572 of signal terminals may a single row. Alternatively, as illustrated in FIG. 32, two rows may be added along either edge of the baseboard 570. The terminals in each of the four rows 572 are electrically connected to each other. The four rows of signal terminals are electrically insulated from each other. Thus, each individual row 572 of signal terminals can receive/transmit a different signal. Additionally, multiple modules may be connected in series as described above.

The additional second rows 572 of signal terminals provided on the baseboard 560 in this way can receive/transmit signal terminals designation determining signals for designating an extension module 580. A designation signal can be introduced from the rows 572 of signal terminals to a designation determining unit 583 of the extension module 580 via a second connector 589 and a communication bus 585 for designation determination. In the embodiment illustrated in FIG. 32, the rows 572 of signal terminals that can introduce a designation signal to the designation determining unit 583 are disposed parallel to the rows of source terminals such as in a bus line supporting I2C, CAN, or any other communication mode that allows connection in series. The rows 572 of the terminals output a designation signal for the extension module 580 from the designation determining unit 583 of the extension module 580. Thus, a designation signal can be transmitted to the designation determining unit 583, regardless of the connected position of the extension module 580 along the longitudinal direction of baseboard 560.

In this embodiment, the rows of signal terminals for designation determination are disposed parallel to the rows of source terminals. Alternatively, techniques involving power line communication (PLC) may be applied to use a single line as a source line and a signal line for designation-element designation. In this way, a signal line for designation signals is not required, and the rows of terminals can have a compact configuration.

Figure 33:
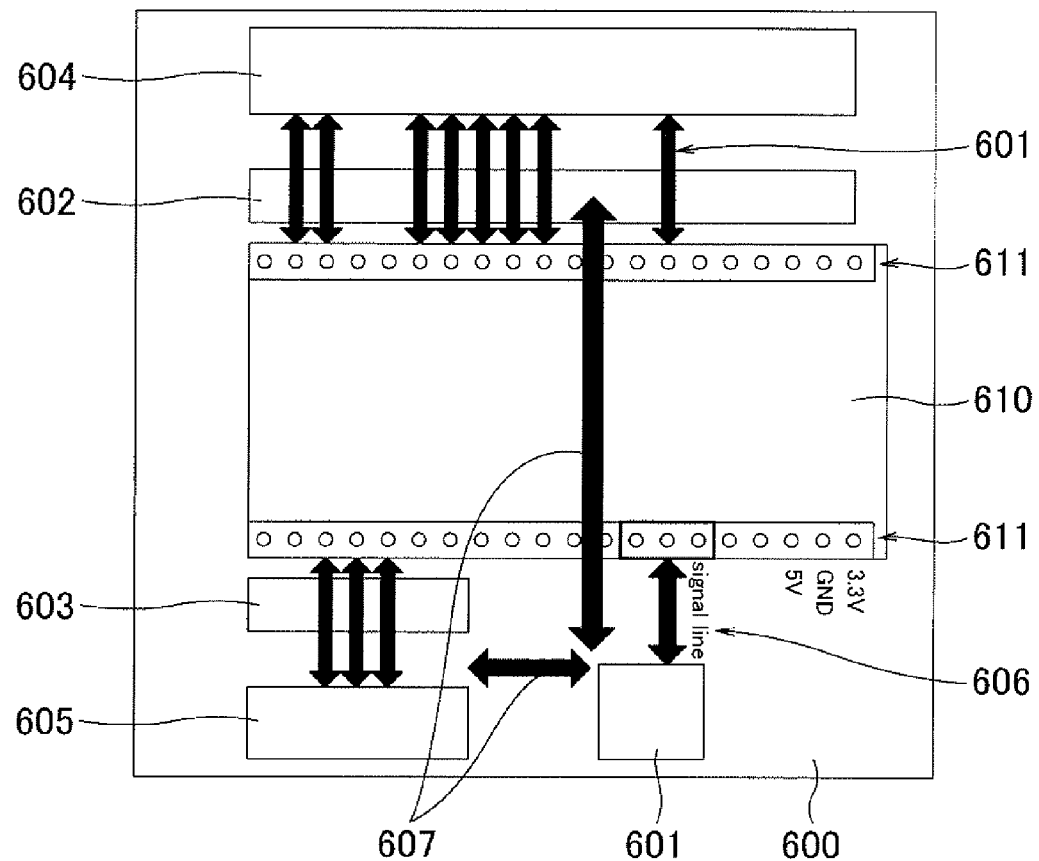
FIG. 33 is a plan view of connectors having a different shape for stacking baseboards.

A change in the shape of connectors allows multiple baseboards to be stacked, as illustrated in FIG. 33. In FIG. 33, a board 600 is not equipped with a microcomputer and practically functions as an extension module. The baseboard 600 according to this embodiment illustrated in FIG. 33 includes connectors 611 or first and second connectors for stacking. Although not apparent in FIG. 33, multiple boards 600 are stacked and connected by the connectors 611. A microcomputer 610 is mounted on the connectors 611 of the board 600 on the top. Multiple boards 600 not provided with microcomputers can be stacked by connecting the connectors 611 to connectors of another board 600.

The boards 600 each include a designation determining unit 601, switching circuits 602 and 603 corresponding to the connectors 611 on both sides, and groups 604 and 605 of devices. The designation determining unit 601 determines and designates the terminal to which the devices and the microcomputer are to be connected on the basis of a signal sent through a signal line 606 connected to a specific terminal of the relevant connector 611 and controls the switching circuits 602 and 603 to authorize the communication between the relevant devices and the microcomputer 610. This embodiment differs from those described above in that the boards 600 each include the groups 604 and 605 of devices having specific functions and that the boards 600 are stackable. In this way, the multiple boards 600 can be stacked, and the microcomputer 610 and the devices 604 and 605 can be connected through switching among multiple pins of the stacked the boards 600.

Figure 34:
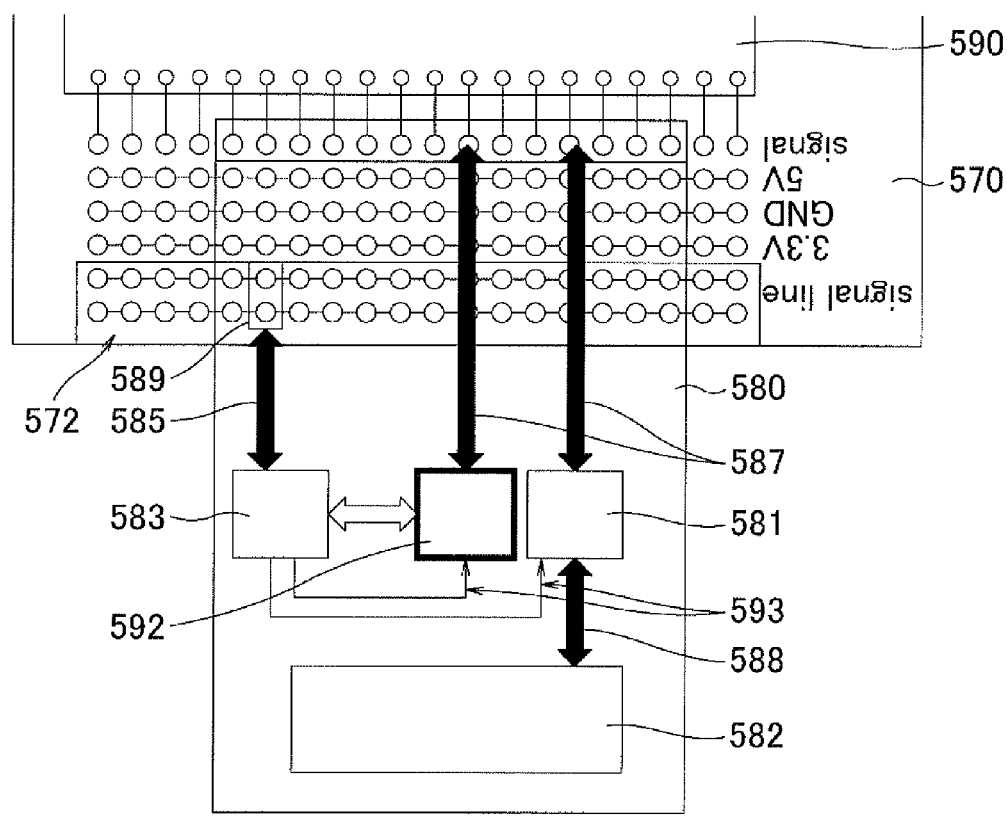
FIG. 34 is a plan view of an exemplary baseboard and an exemplary extension module that can automatically determine the attached position of the extension module.

The attachment of an extension module to a baseboard changes the circuit configuration. Handling can be facilitated by determining the attached extension modules and their attached positions. FIG. 34 illustrates automatic determination of the attached position of an extension module. In the embodiment illustrated in FIG. 34, a baseboard 570 has the same configuration as that of the baseboard illustrated in FIG. 32 and has rows 572 of signal terminals disposed parallel to rows of source terminals. The rows 572 of signal terminals may consist of one or more rows. Similar to the extension module illustrated in FIG. 32, an extension module 580 includes switching circuits 581, devices 582, a designation determining unit 583, and a connector 589 that connects to two terminals respectively from the two rows 572 of signal terminals. This configuration differs from that illustrated in FIG. 32 in that a second switching circuit 592 is provided for the connection controlled by the designation determining unit 583 between an input/output terminal of the designation determining unit and a signal input/output terminal of a microcomputer 590.

The designation determining unit 583 opens/closes the switching circuits 581 and 592 in accordance with designation determination signals sent via the connector 589 and the communication bus 585. Reference numeral 593 denotes control lines for the switching circuits 581 and 592. The second switching circuit 592 electrically transmits an input/output signal from the designation determining unit 583 to the baseboard 570. The authorization for the transmission is based on a signal from the designation determining unit 583. In this embodiment, multiple extension modules 580 may be stacked and connected.

A method of communicating between the baseboard 570 and the extension module 580 according to this embodiment will now be described. The designation determining unit 583 receives a command from the microcomputer 590 via a signal line 572 for designation determination. The signal from the input/output terminal of the microcomputer 590 is invalidated at the first switching circuit 581 and validated at the second switching circuit 592. If the second switching circuit 592 is activated, the input/output terminal of the microcomputer 590 is connected to the input/output terminal of the designation determining unit 583. In this state, the address of the designation determining unit 583 is designated, and a signal is output from the input/output terminal of the designation determining unit 583. On reception of this signal, the baseboard 570 equipped with the microcomputer 590 can determines the address of the extension module 580 indicating the position of the input/output terminal connected to the extension module 580. That is, the microcomputer 590 automatically determines the circuit configuration and determines the signal transmission required for achieving desired functions. In addition to the attached position, the number and type of terminals and various sets of information required for the circuits of the extension module may be sent through the same signal from the designation determining unit for precise operation.

Figure 35:
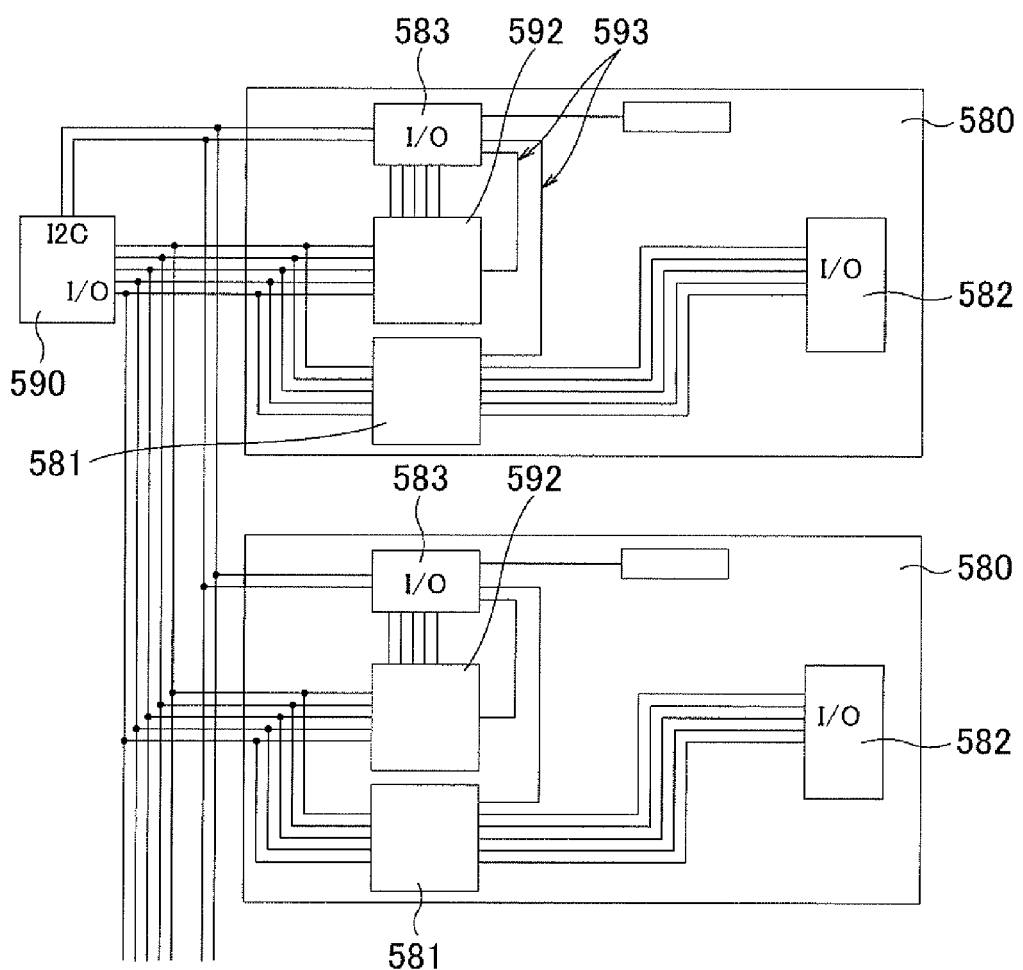
FIG. 35 is a circuit diagram illustrating a detailed example circuit using an I2C I/O expander or designation determining unit.

FIG. 35 illustrates a specific example of a circuit including an I2C I/O expander as the designation determining unit 583. The configuration is basically the same as that illustrated in FIG. 34. Thus, the components that are the same as those in FIG. 34 are designated by the same reference numerals. The designation determining unit 583 may be a unit other than an I2C I/O expander that achieves specific functions through a communication mode allowing connection in series.

Referring to FIGS. 34 and 35, the transmission of a signal from the extension module 580 to the baseboard 570 and the self-determination of the attached position of the addressed extension module 580 will now be described. An address of one of the multiple extension modules 580 connected to each other is selected on the basis of an instruction from the microcomputer 590. The first switching circuit 581 is deactivated and the second switching circuit 592 is activated by transmission to/from a designation determining unit 583 of some extension module 580. In this way, a terminal on the baseboard 570 equipped with the microcomputer 590 is connected to an input/output terminal of the designation determining unit 583 on the selected extension module 580, without connecting to the targeted group of devices.

Upon transmission of an electrical signal from at least one input/output terminal of the designation determining unit 583, the baseboard 570 equipped with the microcomputer 590 can detect the position of the terminals outputting the signal. In this way, the connected position of the extension module 580 can be determined by the baseboard 570. Thus, the connection of an extension module 580 at an improper position can be indicated by an LED or another indicator. If the extension module 580 is connected at an improper position, the switching circuits are controlled to block the transmission of data signals from the microcomputer 590 to the extension module 580. A display of the proper connection position by an LED or other indicators can readily indicate that the connection is improper, allowing handling by someone who is not skilled in the art.

Figure 36:
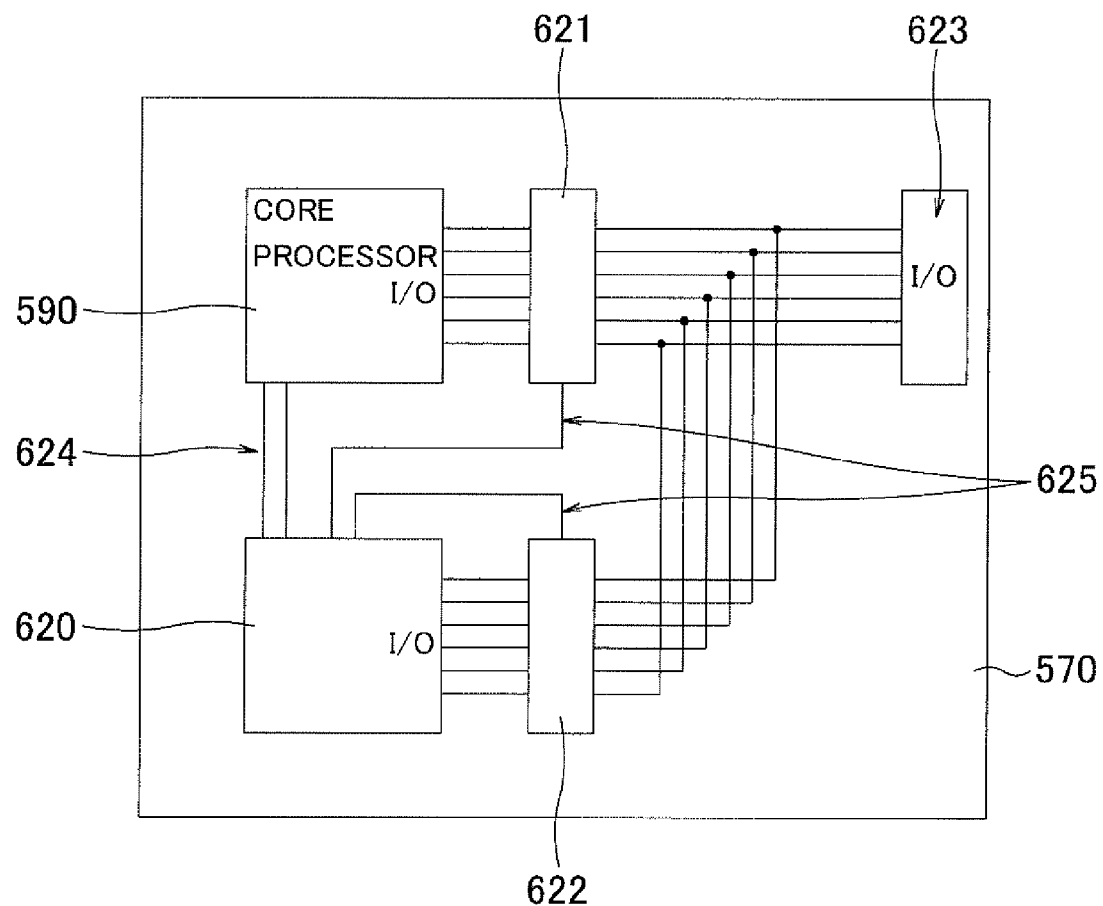
FIG. 36 is a block diagram of an example configuration of a baseboard that can confirm the connected position of an extension module.

Some types of microcomputers cannot dynamically change the function of the terminals during processing. Thus, the process of determining the position of an extension module described above may not be carried out smoothly with only a microcomputer. In consideration of such a case, it is preferred that, as illustrated in FIG. 36, the baseboard 570 equipped with the microcomputer 590 be provided with a control circuit 620 for the switching circuits, a third switching circuit 621 controlled by the control circuit 620, a fourth switching circuit 622, and a connector 623 for connection of extension modules. The control circuit 620 may be an I/O expander.

In the baseboard 570 illustrated in FIG. 36, the switching control circuit 620 disposed on the baseboard 570 deactivates the third switching circuit 621 and activates the fourth switching circuit 622 to electrically connect the input/output terminal I/O of the switching control circuit 620 of the baseboard 570 to the input/output terminal I/O of the designation determining unit of the extension module via the connector 623. If the input/output terminal of the switching control circuit 620 receives a confirmation signal of the connecter connection position from the designation determining unit 583 on the extension module, a microcomputer that cannot dynamically change the function of a terminal can confirm the connected position of the extension module.

The input and output of the input/output terminal I/O of the designation determining unit of the extension module and the input/output terminal I/O of the switching control circuit 620 of the baseboard 570 may be reversed such that a signal output from the baseboard 570 is received by the extension module and is transmitted to the microcomputer 590 of the baseboard 570 via a communication bus. If the extension modules can confirm the mutual connected positions, many extension modules can be connected to build up a large system.

Figure 37:
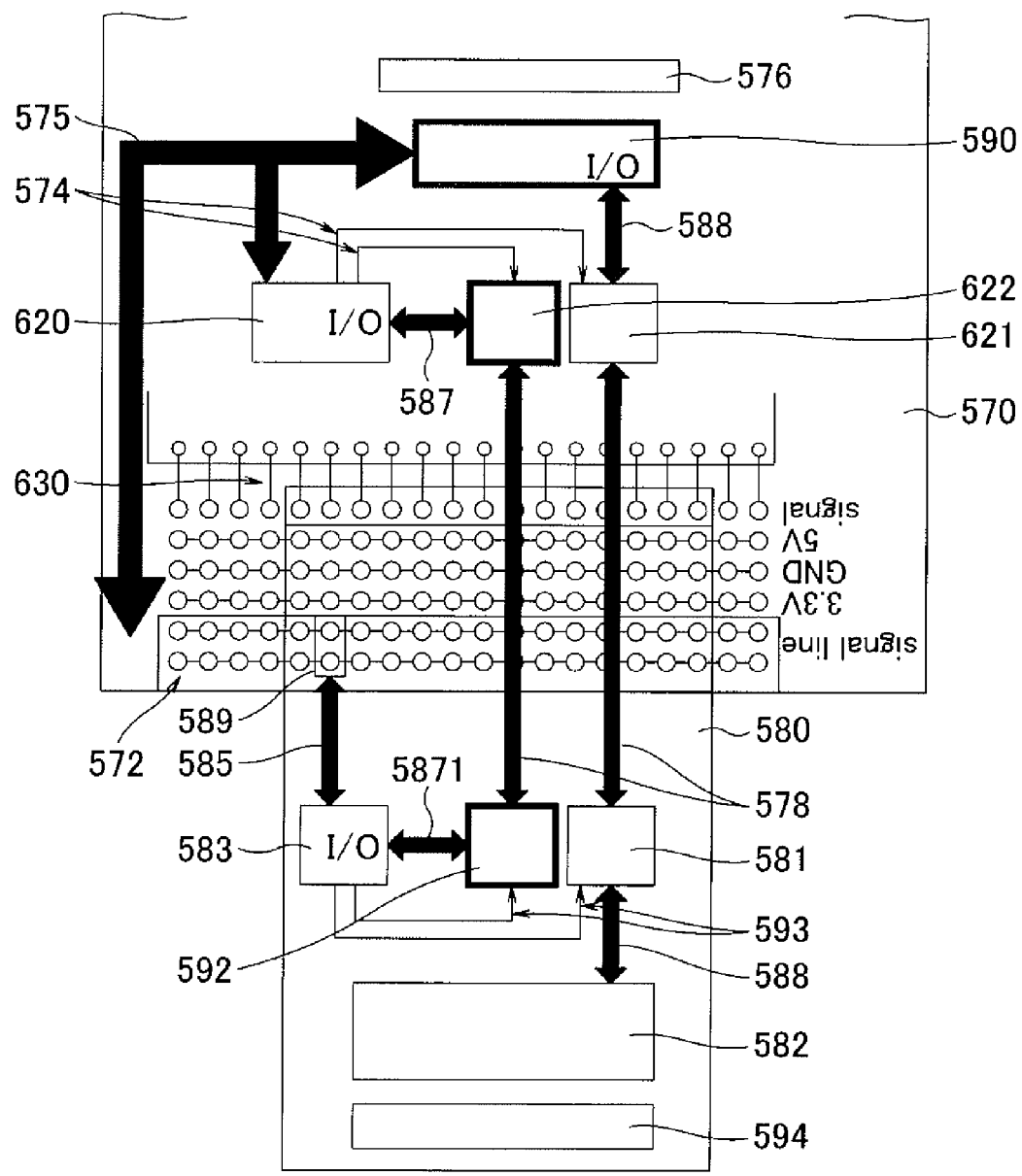
FIG. 37 is a block diagram illustrating a flow of signals through a baseboard illustrated in FIG. 26 and an extension module connected to thereto.

FIG. 37 illustrates a flow of signals through the baseboard 570 in FIG. 36 and the extension module in FIGS. 34 and 35, which are connected to each other. Similar to the embodiment illustrated in FIG. 36, the baseboard 570 in FIG. 37 includes a microcomputer 590, a switching control circuit 620, a third switching circuit 621, a fourth switching circuit 622, and an indicator 576. The baseboard 570 is connected to an extension module 580, which is similar to the extension module illustrated in FIG. 34, at a connecting part 630 consisting of a first connector on the baseboard 570 and a second connector on the extension module 580. The baseboard 570 includes a designation determining unit 583, a first switching circuit 581, a second switching circuit 592, a device 582 having a specific function, and an indicator 594. The microcomputer 590, the switching control circuit 620, the designation determining unit 583, and the switching circuits are all connected in series via a communication bus.

The microcomputer 590 transmits and receives signals to confirm the connection between the input/output terminal I/O of the designation determining unit 583 on the extension module 580 and the input/output terminal I/O of the switching control circuit 620 of the baseboard 570 and confirms the connected position of the extension module 580 for each address. The proper connection of the extension module 580 is indicated by the indicators 576 of the baseboard 570 and the indicator 594 of the extension module 580.

Reference numeral 574 denotes control lines of the switching circuits 621 and 622 of the baseboard 570, and the reference numeral 593 denotes control lines of the switching circuits 581 and 592 of the extension module 580. Identical signals are sent to signal buses 575 and 585 to control the designation determining unit 583 and the switching control circuit 620 connected to the microcomputer 590 and other components. The signal bus 578, the designation determining unit 583, and the switching control circuit 620 control the switching circuits 621, 622, 592, and 581. Such control is carried out to select between the connection of the input/output terminal of the designation determining unit 583 and the input/output terminal of the switching control circuit 620 via the switching circuits 592 and 622 and the signal buses 587, 578, and 5871 and the connection of the microcomputer 590 and a group 582 of devices of the extension module 580 via the switching circuits 581 and 621 and the signal buses 588 and 578. The signal lines controlling the switching circuits are represented by reference numerals 574 and 593.

Multiple extension modules 580 may be stacked and connected to each other. Connection indicators 576 and 594 indicate the state of the connection of the circuits, such as the validity of the connected positions. The connection indicators 576 and 594 may be controlled on the basis of a signal from the input/output terminal I/O of the switching control circuit 620 of the baseboard 570 equipped with the microcomputer 590 or a signal from the input/output terminal I/O of the designation determining unit 583 of the extension module 580. Alternatively, the connection indicators 576 and 594 may be controlled by signals output from the input/output terminals of the designation determining unit 583 and the switching control circuit 620 in accordance with a program stored in the microcomputer 590. Any type of signal may be used to indicate the connected positions of the circuits and the state of the connection.

In FIG. 37, an additional input/output terminal may be provided on the baseboard 570 for the reception of a position signal of the extension module 580. This input/output terminal may be connected to the input/output terminal of the baseboard 570, and a terminal connected to the input/output terminal of the designation determining unit may also be provided on the extension module 580. In this way, the position of the extension module 580 can be determined automatically, even without the switching circuit 622 of the baseboard 570 and the switching circuit 592 of the extension module 580. In addition to the attached position, the number and type of terminals and various sets of information required for the circuits of the extension module may be sent through the same signal from the designation determining unit for precise operation.

Figure 38:
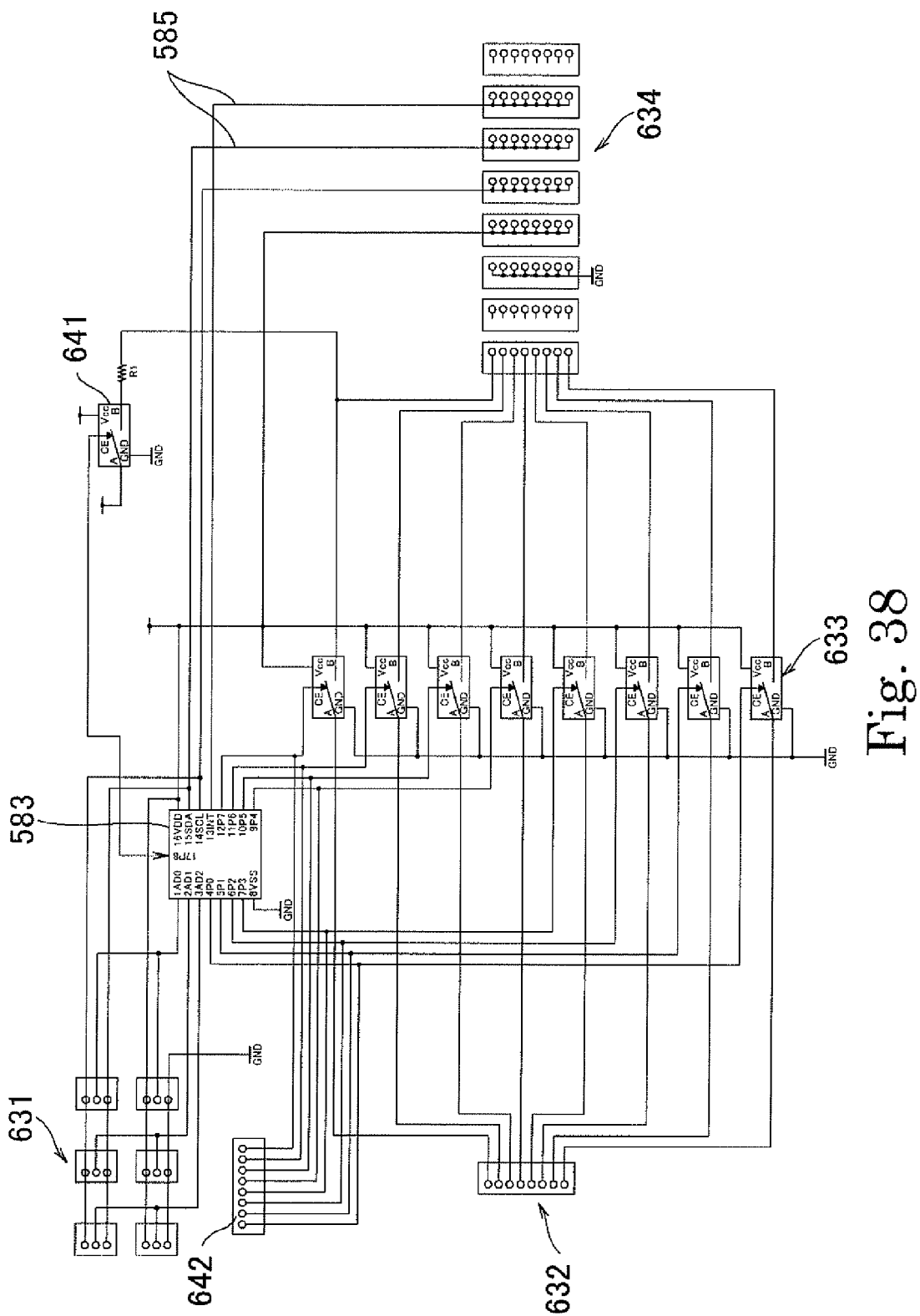
FIG. 38 is a circuit diagram of an example circuit of the extension module illustrated in FIG. 26.

FIG. 38 illustrates an example circuit of the extension module 580. The extension module 580, as described above, includes a designation determining unit 583 and a group 634 of connectors for connection between the extension module 580 and a baseboard, and further includes a group 633 of switching circuits that have the same function as the switching circuits 581, a switching circuit 641 that is similar to the switching circuit 592, an addressing unit 631 that designates a specific address in advance for identification of the module, a group 632 of input/output terminals connected to a targeted group of devices, and input/output terminals 642 for indication of the input/output of the designation determining unit 583. The group 634 of connectors facilitates stacking multiple extension modules. The state of the connection of the extension module can be confirmed by deactivating the group 633 of switching circuits, activating the switching circuit 641, applying a voltage from some of the terminals in the group of terminals of the extension module, reading the applied voltage at the baseboard, and indicating the result with the indicator.

Figure 39:
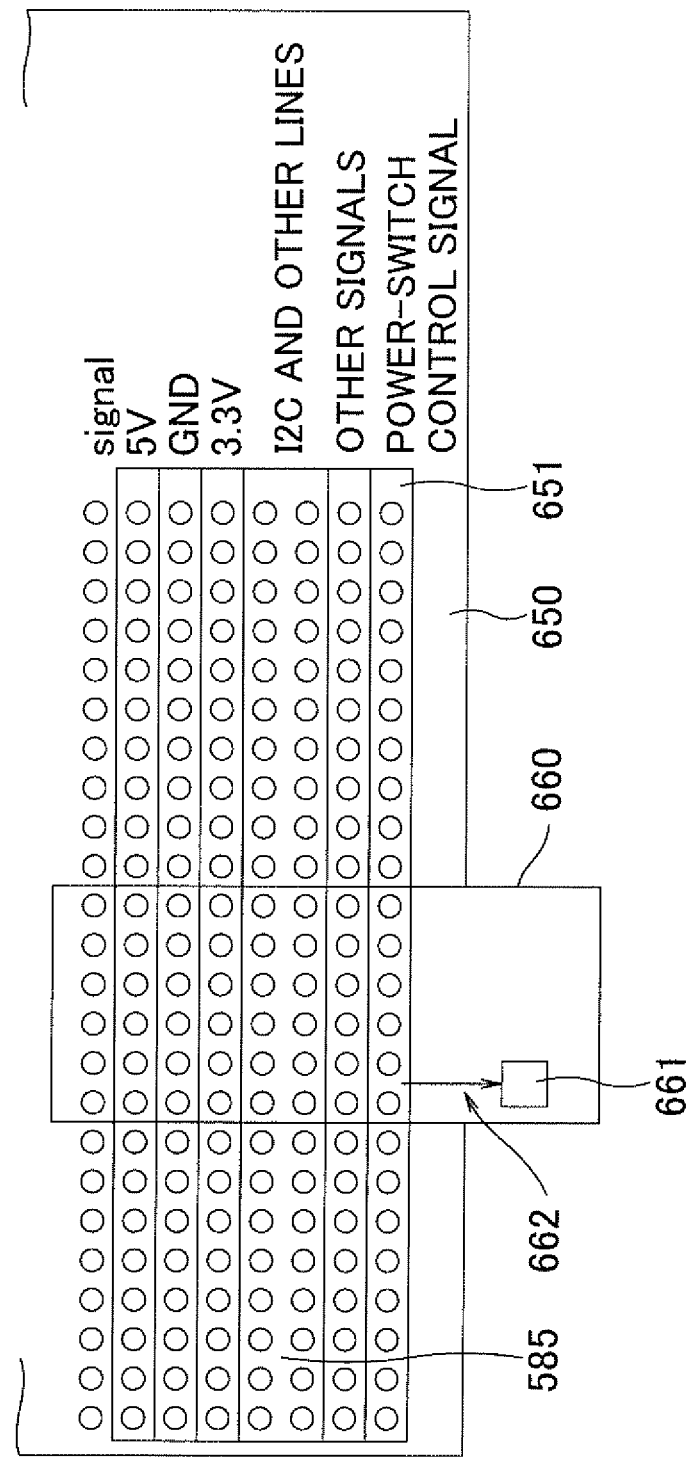
FIG. 39 is a plan view of another example connection of a baseboard and an extension module.

An instruction-signal bus line 585 connected to the switching control circuit may consist of one or more lines. These lines can be used for the designation determining unit 583 and for the control of a relay or switch IC for turning on/off the electrical power of the extension module 660 by providing a row 651 of power-switch control signal terminals, such as that illustrated in FIG. 39, on the connector for the connection of the baseboard 650 and the extension module 660. The lines can also be used for the control of groups of other devices.

The relay or switch IC disposed on the extension module 660 can be turned on/off by a switch circuit 661 for turning on/off a power source in accordance with a signal from a signal line connected to the row 651 of power-switch control signal terminals to stop the electrical power supplied to the extension module 660. Then, the module on the circuit may be switched. In this way, the extension module 660 can be replaced without turning off the power source to the microcomputer. A manual switch may be provided on each extension module and operated to turn off the power source to allow the extension module to be replaced without turning off the power source to the microcomputer. Similar to the switching described above, the power source switch of an extension module may be operated by sending an instruction to a designation determining unit through a signal bus line for the designation determining unit.

In the embodiment described above, the power source is turned on/off in accordance with signals input/output via the row 651 of power-switch control signal terminals. Alternatively, the signals may instruct the shutdown or reset of devices. This can be used for comprehensive control of the connected extension module 660.

When the power source to all the components on the extension module other than the microcomputer is temporarily turned off and turned on again after changing the circuit configuration, the extension module (or device) connected to the circuits can be switched without rebooting the microcomputer by determination of the connected position of the extension module through the procedure described above. An operation test can be conducted every installation of a circuit to the extension module. Devices that should be operated during the replacement of the extension module may be kept on by forcefully sending signals from the designation determining unit to the power source relay and power source IC of the extension module. All power supplies can be automatically or manually turned off at once through simple operation of turning on/off the source lines with a relay, a switch IC, or a manual switch.

Alternatively, a source switch circuit may be operated by a signal from the baseboard equipped with a microcomputer via an input/output terminal I/O of a switching-circuit control circuit or an input/output I/O of a designation determining unit of an extension module, or a signal directly from the microcomputer.

Figure 40:
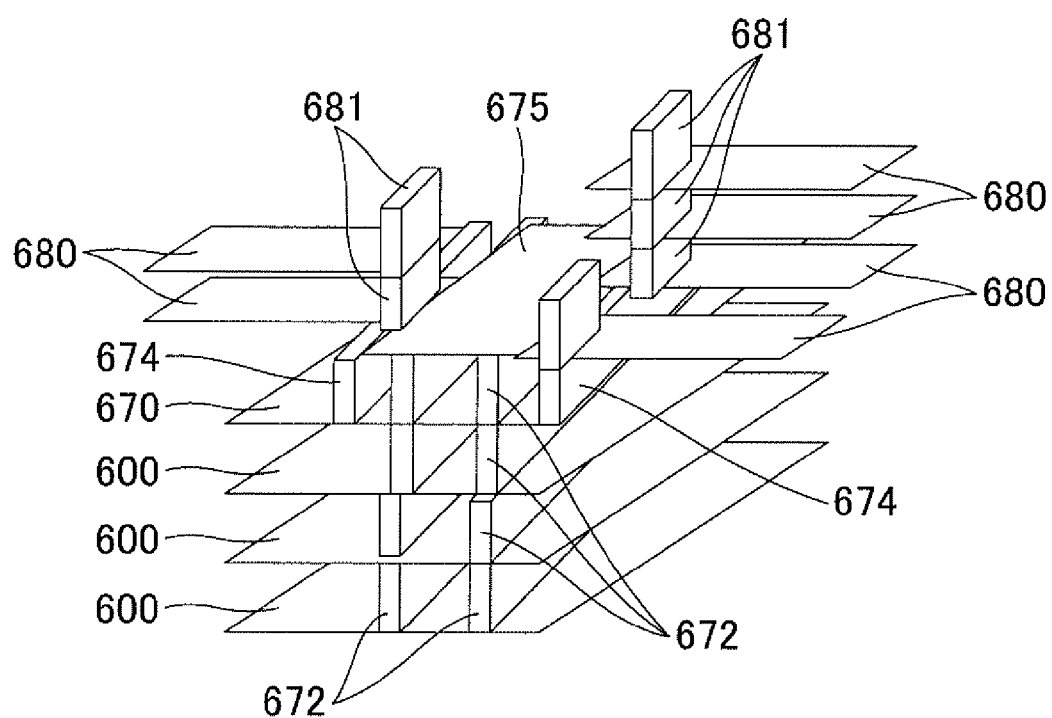
FIG. 40 is a perspective view of another example connection of multiple baseboards and multiple extension modules.

The functions of the extension module and the baseboard can be applied to boards 600, which are not provided with microcomputers, illustrated in FIG. 33. The baseboard 600 illustrated in FIG. 33 may be connected to various types of extension modules. For example, as illustrated in FIG. 40, a board 600 not provided with a signal processing unit, which is illustrated in FIG. 33, may be connected to a baseboard 670 on which a board 675 containing a microcomputer and disposed below the baseboard 670. Various extension modules 680 may be connected to the baseboard 670 and disposed above the baseboard 670. One or more boards 600 may be provided on the baseboard 670. In FIG. 40, reference numeral 672 denotes connectors connecting the boards 600, and reference numeral 681 denotes connectors connecting the extension modules 680 to the upper side of the baseboard 670.

The various extension modules described above may each be partly or entirely provided as a single chip.

Figure 41:
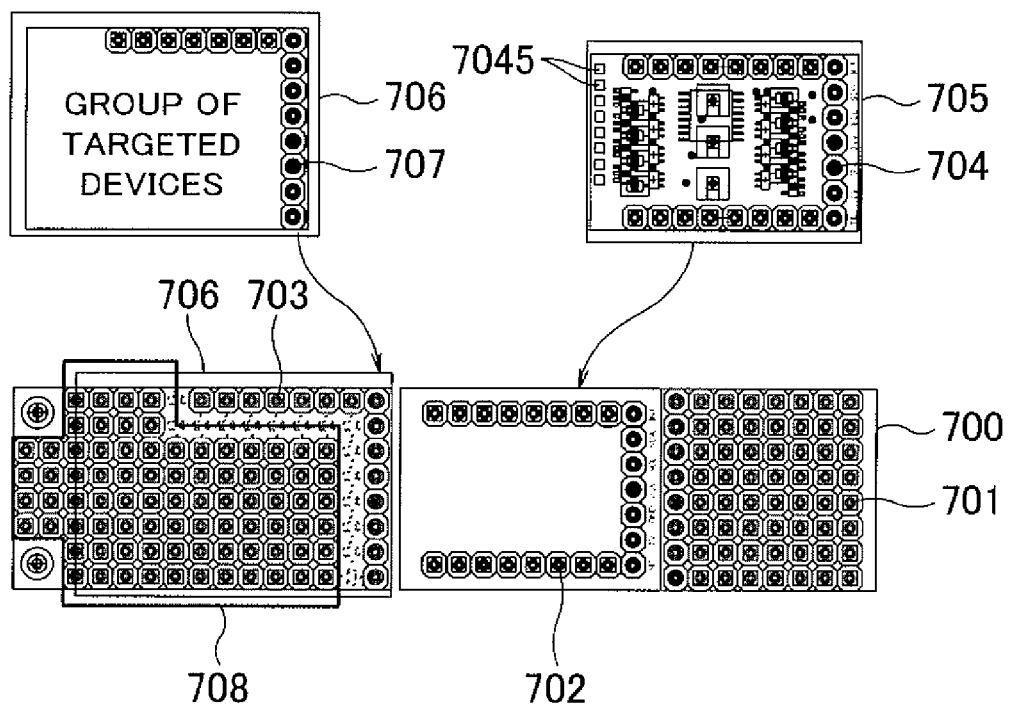
FIG. 41 is a plan view of an example circuit position of an extension module.

FIG. 41 illustrates example positions of circuits on an extension module. The example configuration of a module illustrated in FIG. 41 is based on an adapter board 700 according to an embodiment of the present invention. The adapter board 700 includes a group 701 of second connectors to be connected to a first connector on a baseboard, a bidirectional analog switch for achieving a function according to the present invention, a gate circuit 705 including LEDs for indicating the activation/deactivation of a switching circuit, a group 706 of targeted devices, and an original board 708 other than the group 706 of the targeted devices. The gate circuit 705 is installed by connecting a row 704 of connectors to a row 702 of connectors of the adapter board 700. The group 706 of targeted devices is installed by connecting a row 707 of connectors to a row 703 of connectors on the adapter board 700. The original board 708 is installed by connecting a group of appropriate connectors to the group of connectors on the adapter board 700. The gate circuit 705 is a core circuit of the present invention and can also have a consolidated function of a switching control circuit and a switching circuit on the baseboard.

Figure 42:
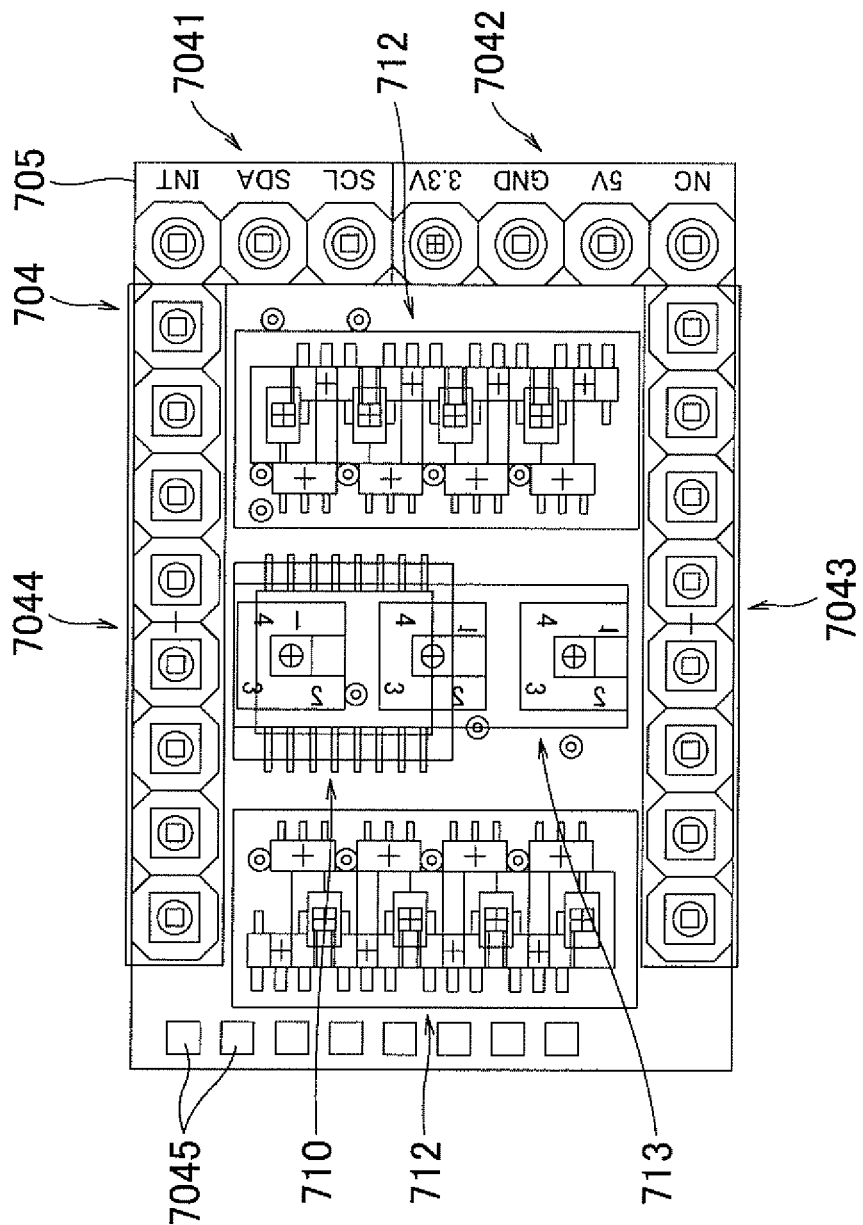
FIG. 42 is an enlarged plan view of a gate circuit disposed on the extension module.

FIG. 42 is an enlarged view of the gate circuit 705. The gate circuit 705 includes a designation determining unit or I/O expander 710, a group 712 of switching circuits, and an addressing circuit 713, which are all disposed on a rectangular board, and includes a row 704 for connection to the adapter board 700 disposed on the peripheral region of the board. The row 704 of the connectors consist of a group 7041 of control-signal input/output connectors, a group 7042 of source connectors, a group 7043 of connectors connected to a target device, and a group 7044 of connectors electrically connected to the group 701 of second connectors for connection to the first connector of the baseboard of the adapter board 700. The group 712 of switching circuits consists of bidirectional analog switches. LEDs 7045 indicating the state of the designation determining unit or I/O expander 710 are provided.

In the embodiment illustrated in FIG. 42, eight bidirectional analog switches are provided for each gate circuit 705. The number of bidirectional analog switches can be varied depending on the number of signal terminals of the I/O expander provided. Since gate circuits 705 have different addresses, individual targets can be controlled independently through the respective channels. The boards can be directly connected with terminals of a microcomputer and stacked and connected to each other in a region including the first and second connectors. The gate circuits 705 have unique addresses. Thus, the microcomputer can be selectively connected to every terminal of the devices on the every board in the stack.

The first and second connectors according to the embodiments described above are designed to be fixe to the baseboard and the board of extension modules. The first and second connectors may partly or entirely extend from the board through cables, or the connectors may be in the form of cables. That is, any connector may be used that can connect an extension module to a baseboard and can connect multiple extension modules each other in series.

The baseboard and extension modules described above are rectangular in plan view. The rows of terminals and connectors disposed along the rows of terminals are arranged linearly. Thus, the rows of connectors on the baseboard have ends, and in some cases, a part of an extension module connected to the baseboard may protrude outward from the connectors. Thus, as illustrated in FIG. 43, a disk baseboard 800 may be provided.

Figure 43:
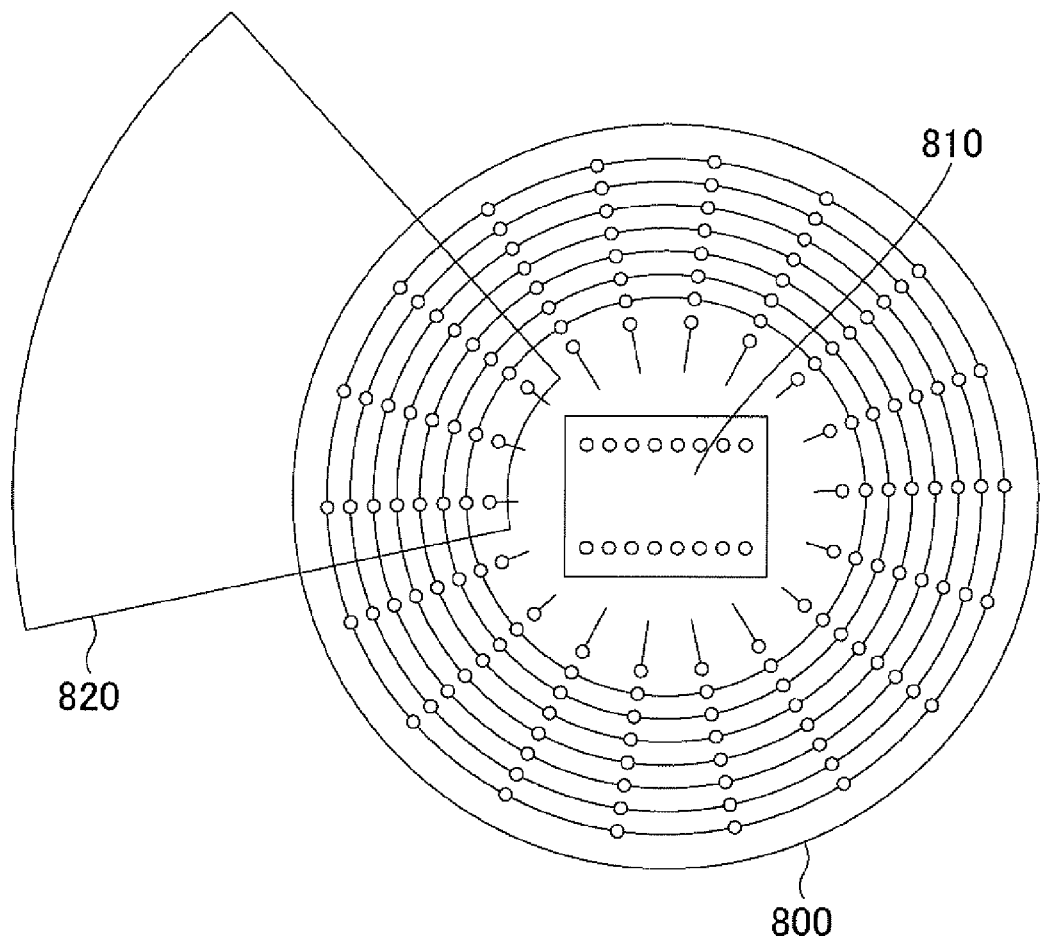
FIG. 43 is a plan view of a baseboard, an extension module, and a structure for connecting the extension module and the baseboard according to another embodiment of the present invention.

In FIG. 43, a disk baseboard 800 has a first connector consisting of ground terminals, source terminals, and signal terminals. These terminals are disposed on concentric circles on the disk baseboard 800 at constant intervals. The ground terminals, the source terminals, and the signal terminals constituting the first connector are disposed continuously around the disk baseboard, i.e., endlessly. A microcomputer 810 is disposed inward of the circularly arranged rows of the first connector and in the center area of the disk baseboard 800.

A second connector of an extension module 820 connected to the first connector of the baseboard 800 includes ground terminals, source terminals, and signal terminals disposed at constant intervals corresponding to the intervals of the ground terminals, source terminals, and signal terminals of the baseboard 800 in the circumferential and radial directions. The second connector is flabelliform and is connected to part of the first connector for mechanical and electrical connection with the baseboard 800. Similarly, a second connector of another extension module 820 may be connected to the remaining part of the first connector. The electrical configuration of the circuits of the baseboard 800 and the extension module 820 may be substantially the same as that of the circuit configuration according to the embodiments described above. Thus, a description of the circuit configuration will not be repeated.

The embodiment illustrated in FIG. 43 has a circular baseboard on which the first connectors arranged endlessly. Thus, an extension module connected to the baseboard does not protrude from the baseboard. In the embodiment illustrated in FIG. 43, the extension module 820 protrudes radially outward of the disk baseboard 800. Alternatively, the extension module 820 may protrude radially inward of the disk baseboard 800 or protrude both radially inward and outward. If the extension module 820 protrudes radially inward, the extension module 820 preferably covers the microcomputer 810.

As described above, the signal processing unit according to the present invention may be an IC, such as an ASIC or an FPGA, or a specialized IC provided for embodiments of the present invention, which practically functions as a microcomputer. If the microcomputer can operate with automatic and dynamic changes in the functions of the terminals in accordance with the specification of the extension modules, the extension modules can be connected to any of the terminals of the baseboard. This is extremely convenient and user-friendly.

Figure 44:
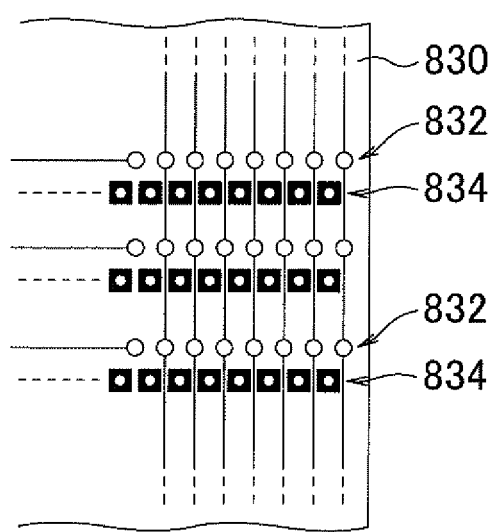
FIG. 44 is a plan view of an example arrangement of a first or second connector on a baseboard or extension module according to the present invention.

The first connector of the baseboard and the second connector of the extension module include source terminals, ground terminals, and signal terminals arranged at a constant pitch, and another terminal may be disposed between the individual two terminals of the first and second connectors. These terminals can be arranged without limitation, and the pitch may be constant or irregular. FIG. 44 illustrates such an example. In FIG. 44, a board 830 is a baseboard or a board of an extension module. The board 830 has multiple first or second connectors 832 disposed at a constant pitch as a result of an arrangement of source terminals, ground terminals, and signal terminals at a constant pitch. Other connectors 834 are disposed between the terminals constituting the first or second connectors 832, such as the source terminals, the ground terminals, and the signal terminals. The connectors 834 can be used in any application. The arrangement of a group of signal terminals is not limited; the signal and source terminals of the connectors 832 and 834 may be interchangeable, and a signal terminal may be input to a plurality of terminals.

In the present invention, the baseboard may be provided with any connector in addition to the first connector. For example, a second connector that connects to the first connector may be provided. That is, a baseboard has a second connector including multiple triplets of terminals, the triplets consisting of a ground terminal connectable to a ground terminal of the first connector, a source terminal connectable to a source terminal of the first connector, and a signal terminal connectable to a signal terminal of the first connector. With such a configuration, the second connector can be connected to a first connector of another baseboard, and multiple baseboards can be stacked and electrically connected to extend the functions.

Figure 45:
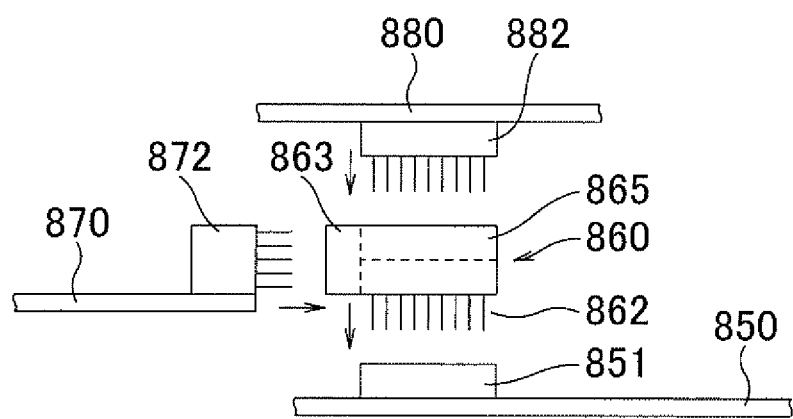
FIG. 45 is a side view of another example connection of a baseboard and extension modules.
Figure 46:
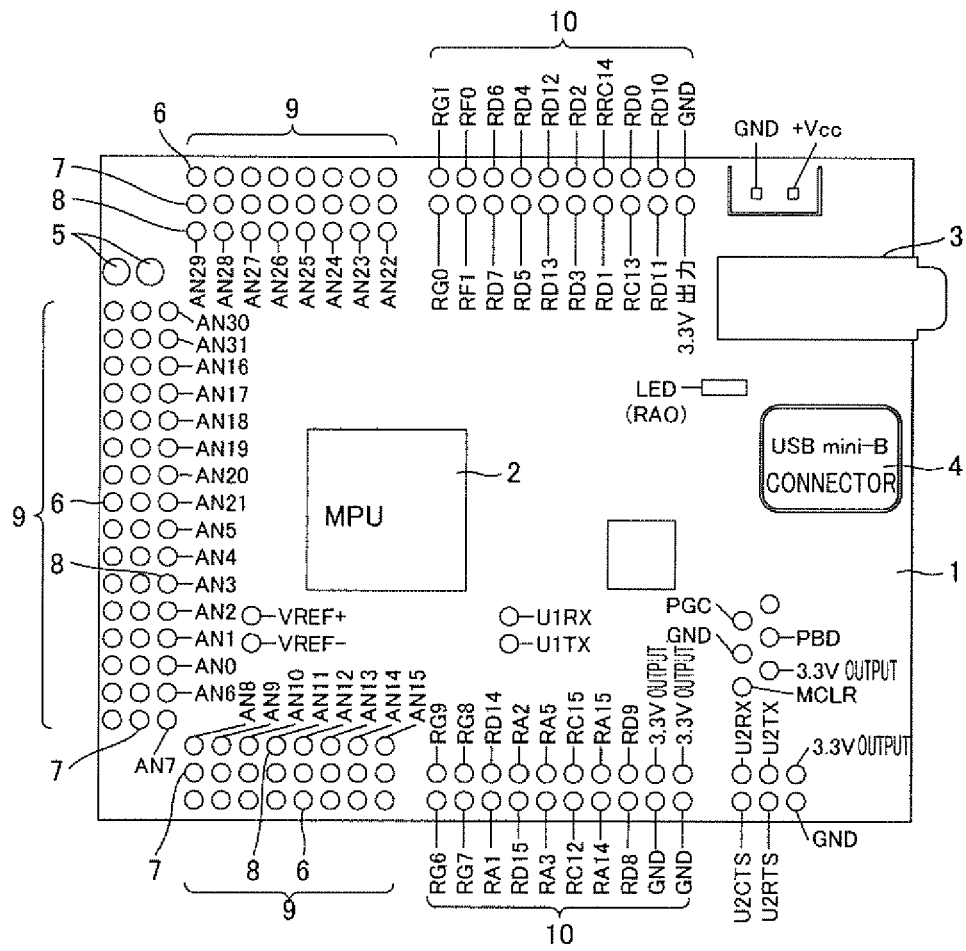
FIG. 46 is a plan view an example of a conventional baseboard.
Figure 47:
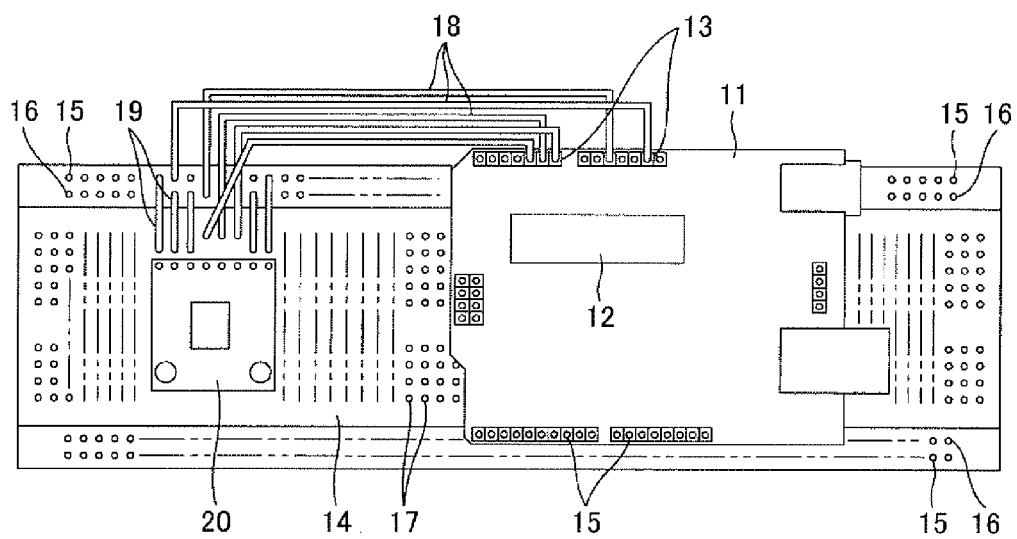
FIG. 47 is a plan view of an example structure for connecting a conventional baseboard and an extension module.

As illustrated in FIG. 45, a mediating connector 860 may be disposed between a baseboard 850 and an extension module 870 or another extension module 880. The mediating connector 860 has a second connector 862 connectable to a first connector 851 of the baseboard 850, a first connector 863 connectable to a second connector 872 of an extension module 870, and a first connector 865 connectable to a second connector 882 of another extension module 880.

The mediating connector 860 illustrated in FIG. 45 may be used in combination with a baseboard to achieve various connections with an extension module. The baseboard 850 may be connected to a second connector of the baseboard not equipped with a signal processing unit via the mediating connector 860. The baseboard not equipped with a signal processing unit may function as an extension module.

REFERENCE SIGNS LIST 100 baseboard
101 microcomputer board
102 microcomputer
110 first connector
111 ground terminal
113 signal terminal
120 first connector
121 ground terminal
122 source terminal
123 signal terminal
112 source terminal
140 first connector
142 ground terminal
143 source terminal
144 signal terminal

The invention claimed is:

1. An extension module connectable to a baseboard comprising a first connector, the extension module comprising:
   a plurality of circuits to process periodic signals and to control the circuits processing periodic signals at a variation timing of a signal within a constant period; and
   a second connector connectable to the first connector of the baseboard for connection to the baseboard, the second connector comprising at least one second terminal suit, the at least one second terminal suit comprising a second ground terminal connectable to a first ground terminal of the first connector, a second source terminal connectable to a first source terminal of the first connector, and a second signal terminal connectable to a first signal terminal of the first connector,
   wherein the plurality of circuits are stackable and configured such that a signal from the second signal terminal of the at least one second terminal suit sequentially controls the operation of the plurality of circuits to process periodic signals within a constant period.

2. The extension module according to claim 1, further comprising:
   another first connector connectable to the second connector of another extension module for stacking the extension module and the another extension module.

3. A connection structure, comprising:
   a baseboard;
   at least one extension module connectable to the baseboard;
   a first connector on the baseboard, the first connector of the baseboard comprising a plurality of terminal suits disposed at a constant pitch, each suit comprising a ground terminal connected to a ground line, a source terminal connected to a source line, and a first signal terminal connected to a signal line; and
   a second connector on the at least one extension module and fitting to the first connector of the baseboard, the second connector comprising at least one terminal suit comprising a ground terminal connected to the ground line, a source terminal connected to the source line, and a first signal terminal connected to the signal line,
   wherein
      the baseboard and the at least one extension module are connected by the first connector and the second connector, and
      the plurality of terminal suits of the first connector of the baseboard each further comprise a second signal terminal aligned with the first signal terminal of the first connector, the second signal terminal functioning as an input/output terminal of a signal designating a specific extension module of the at least one extension module.

4. The connection structure according to claim 3, wherein the at least one extension module is a plurality of extension modules, a first of the plurality of extension modules comprises a first connector connectable to the second connector of another extension module forming a stack of the plurality of extension modules, a specific extension module in the stack receiving a control signal from the baseboard to achieve a specific function.

5. The connection structure according to claim 4, wherein one or more of the plurality of extension modules forming a stack switch between a connected state and a disconnected state to the source line, and extension modules in the disconnected state are replaceable while the extension modules in the connected state maintain connection to a power supply.

6. The connection structure according to claim 3, wherein the baseboard has a signal processing unit, and the baseboard connects to a plurality of extension modules, each extension module comprising an addressing unit to designate an address and a designation determining unit to determine the matching of an address signal from the signal processing unit and an address designated by the addressing unit.

7. The connection structure according to claim 6, wherein the plurality of extension modules comprises respective circuits to operate the respective extension modules if the respective designation determining units determine the matching of address signals from the signal processing unit and addresses designated by the respective addressing units.

8. The connection structure according to claim 3, further comprising:
   rows of signal terminals, the rows being electrically isolated from one another.

9. The connection structure according to claim 3,
   wherein the baseboard has a signal processing unit and the at least one extension module has a designation determining unit, and
   wherein the at least one extension module is in connection with the signal processing unit and transmits and receives a signal to and from the baseboard, the baseboard determining a connected position of the at least one extension module on the basis of a signal from the designation determining unit.

10. The connection structure according to claim 9, wherein the baseboard or the at least one extension module comprises an indicator indicating a state of attachment of the at least one extension module.

11. The connection structure according to claim 3, wherein the baseboard has a disk shape, the plurality of terminal suits of the first connector of the baseboard are disposed concentrically and along a radial direction of the baseboard, and the at least one terminal suit of the second connector of the at least one extension module is connectable to the first connector of the baseboard.

12. The connection structure according to claim 11, wherein the plurality of terminal suits of the first connector are arranged in series on a circle on the baseboard.

13. The connection structure according to claim 3, wherein the baseboard is connectable to another baseboard.

14. The connection structure according to claim 3, wherein the baseboard controls disconnection and connection to the source line for the at least one extension module.

15. The connection structure according to claim 3, further comprising:
   a mediating connector comprising a first connector, another first connector, and a second connector, the first connector of the mediating connector being connectable to the first connector of the baseboard, and the another first connector of the mediating connector being connectable to the at least one extension module or another baseboard.

* * * * *